(12) United States Patent
Ohm et al.

(10) Patent No.: US 11,355,763 B2
(45) Date of Patent: Jun. 7, 2022

(54) CELL-MONITORING CONNECTOR CONFIGURED TO BE DETACHABLY MOUNTED TO FUEL CELL

(71) Applicants: Hyundai Motor Company, Seoul (KR); Kia Motors Corporation, Seoul (KR); Yura Co., Ltd., Hwaseong-si (KR)

(72) Inventors: Ki Wook Ohm, Yongin-si (KR); Min Seok Kim, Yangpyeong-gun (KR)

(73) Assignees: Hyundai Motor Company, Seoul (KR); Kia Motors Corporation, Seoul (KR); Yura Co., Ltd., Hwaseong-si (KR)

( * ) Notice: Subject to any disclaimer, the term of this patent is extended or adjusted under 35 U.S.C. 154(b) by 246 days.

(21) Appl. No.: 16/837,437

(22) Filed: Apr. 1, 2020

(65) Prior Publication Data

US 2021/0143449 A1 May 13, 2021

(30) Foreign Application Priority Data

Nov. 12, 2019 (KR) .......................... 10-2019-0144323

(51) Int. Cl.
| | |
|---|---|
| *H01M 8/0247* | (2016.01) |
| *H01R 13/629* | (2006.01) |
| *H01M 8/2485* | (2016.01) |
| *H01R 13/627* | (2006.01) |
| *H01M 8/10* | (2016.01) |

(52) U.S. Cl.
CPC ....... *H01M 8/0247* (2013.01); *H01M 8/2485* (2013.01); *H01R 13/6273* (2013.01); *H01R 13/62933* (2013.01); *H01M 2008/1095* (2013.01); *H01R 13/6271* (2013.01)

(58) Field of Classification Search
CPC combination set(s) only.
See application file for complete search history.

(56) References Cited

U.S. PATENT DOCUMENTS

| 5,928,038 A | 7/1999 | Berg et al. |
|---|---|---|
| 2009/0104503 A1 | 4/2009 | Shirahama |
| 2018/0351182 A1* | 12/2018 | Hood ..................... H01M 8/241 |

FOREIGN PATENT DOCUMENTS

| JP | 3092066 B2 | 9/2000 |
|---|---|---|
| JP | 5011759 B2 | 8/2012 |

* cited by examiner

*Primary Examiner* — Ula C Ruddock
*Assistant Examiner* — Sarika Gupta
(74) *Attorney, Agent, or Firm* — Slater Matsil, LLP

(57) ABSTRACT

A cell-monitoring connector is configured to be detachably mounted to a fuel cell. A housing configured such that a portion thereof is insertable into a receiving space. A pair of lever operators is configured to be movable by a first external pressure in a third direction that intersects the first direction and the second direction. A number of levers are coupled to the pair of lever operators inside the housing. The levers include latching protrusions configured to operate in connection with movement of the lever operators. The latching protrusions are movable between a first position at which the latching protrusions protrude in the third direction from an outer surface of the housing and a second position at which the latching protrusions do not protrude from the outer surface of the housing.

20 Claims, 16 Drawing Sheets

CELL-MONITORING CONNECTOR CONFIGURED TO BE DETACHABLY MOUNTED TO FUEL CELL

CROSS-REFERENCE TO RELATED APPLICATIONS

This application claims priority to Korean Patent Application No. 10-2019-0144323, filed on Nov. 12, 2019, which application is hereby incorporated herein by reference.

TECHNICAL FIELD

Embodiments relate to a cell-monitoring connector configured to be detachably mounted to a fuel cell.

BACKGROUND

A fuel cell stack is a device that supplies power, generated through the electrochemical reaction between air supplied to one surface of a polymer electrolyte membrane and hydrogen supplied to the opposite surface of the polymer electrolyte membrane, to an external load.

A fuel cell stack may have a structure in which hundreds of cells are stacked. When the unit cells operate normally during the operation of the fuel cell stack, the unit cells may generate a predetermined magnitude of voltage. If any one of hundreds of cells fails to exhibit normal performance, the total output of the fuel cell stack is lowered. If the reverse voltage phenomenon continues, the operation of the fuel cell stack needs to be stopped.

A cell-monitoring connector checks the state of the cells and continuously monitors the voltage of the cells. To this end, the cell-monitoring connector may be electrically connected to the cells in order to check the voltage of each unit cell of the fuel cell stack. Studies on various structures for securely coupling a cell-monitoring connector to a fuel cell stack have been conducted.

SUMMARY

Accordingly, embodiments are directed to a cell-monitoring connector configured to be detachably mounted to a fuel cell and can substantially obviate one or more problems due to limitations and disadvantages of the related art.

Embodiments provide a cell-monitoring connector configured to be detachably mounted to a fuel cell with exhibiting improved reliability.

In a cell-monitoring connector configured to be detachably mounted to a fuel cell according to one embodiment, the fuel cell may include a plurality of separators disposed so as to be spaced apart from each other in a first direction, each of the separators including a receiving recess formed therein, and a plurality of latching parts, each being disposed near the receiving recess. The cell-monitoring connector may include a housing configured such that at least a portion thereof is inserted into a receiving space, defined by the receiving recess formed in each of the separators, in a second direction that intersects the first direction, a pair of lever operators configured to be movable by a first external pressure in a third direction that intersects the first direction and the second direction, and a plurality of levers respectively coupled to the pair of lever operators inside the housing. The plurality of levers may include a plurality of latching protrusions configured to operate in connection with movement of the lever operators, the latching protrusions moving between a first position at which the latching protrusions protrude in the third direction from an outer surface of the housing and a second position at which the latching protrusions do not protrude from the outer surface of the housing so as to be caught by or released from the latching parts.

For example, each of the pair of lever operators may include a first head portion configured to receive the first external pressure and a first tail portion extending from the first head portion to be connected to the plurality of levers, and the plurality of levers may include a plurality of second head portions connected to the first tail portion and a plurality of second tail portions respectively extending from the plurality of second head portions, each of the second tail portions being provided with a respective one of the latching protrusions.

For example, the first width in the first direction of the first head portion may be the same as the second width in the first direction of the cell-monitoring connector.

For example, each of the lever operators may be linearly moved in the second direction between an introduced position and a withdrawn position by a second external pressure that is different from the first external pressure, and may be coupled to the plurality of levers.

For example, the first tail portion may include a first surface that faces the plurality of second head portions, and each of the plurality of second head portions may include a second surface that faces the first surface. One of the first surface and the second surface may include at least one recess, and the remaining one of the first surface and the second surface may include at least one projection having a shape corresponding to the shape of the at least one recess. When each of the lever operators linearly moves, the at least one recess and the at least one projection may be coupled to each other in a sliding manner.

For example, the at least one recess may include a plurality of recesses, and the at least one projection may include a plurality of projections. When each of the lever operators is located at the introduced position, all of the recesses may be coupled to all of the projections, and when each of the lever operators is located at the withdrawn position, some of the recesses may be coupled to some of the projections.

For example, when the housing is inserted into the receiving space in the second direction and the plurality of latching protrusions is caught by the plurality of latching parts at the first position, each of the lever operators may be linearly movable in the second direction from the withdrawn position to the introduced position.

For example, the receiving recess may include a lower surface facing the housing to be received in the receiving recess, and a side surface extending from the lower surface in the second direction to define the receiving recess together with the lower surface. The housing may include a front surface facing the lower surface, a back surface formed opposite the front surface, and an upper surface and a lower surface formed opposite each other in the third direction between the front surface and the back surface. The outer surface of the housing may correspond to at least one of the upper surface or the lower surface.

For example, the cell-monitoring connector may further include a terminal position assurance (TPA) capable of being disposed between the pair of lever operators. The TPA may include a fixing piece coupled to the housing and a third head portion extending from the fixing piece so as to be disposed on the back surface of the housing.

For example, the pair of lever operators may be elastic to be restored in a direction opposite the third direction when the first external pressure is not applied thereto.

For example, when the plurality of latching protrusions is not in the state of being caught by the plurality of latching parts, the first head portion may have a width in the third direction so as to overlap at least a portion of the third head portion in the second direction.

For example, wherein, when at least a portion of the housing is in the state of being inserted into the receiving space, the plurality of latching protrusions located at the first position may be caught by the plurality of latching parts, and when the pair of lever operators is located at the introduced position, the first head portion and the third head portion may be disposed opposite each other in the third direction on the back surface of the housing.

For example, when the first head portion and the third head portion are opposite each other, the spacing distance in the third direction between the first head portion and the third head portion may be greater than 0 and may be less than a mounting/demounting distance.

For example, the cell-monitoring connector may further include a first connector and a second connector disposed adjacent to each other in the first direction, the first connector may include a first stepped portion formed in a side surface thereof, and the second connector may include a second stepped portion formed in a side surface thereof to mesh with the first stepped portion.

For example, the length from the first stepped portion to the upper edge or the lower edge of the first connector in the third direction may be different from the length from the second stepped portion to the upper edge or the lower edge of the second connector in the third direction.

For example, the cell-monitoring connector may further include at least one damage-preventing part disposed so as to protrude from the front end of the housing in a direction opposite the direction in which the first external pressure is applied to each of the pair of lever operators.

For example, each of the plurality of separators may be fitted into at least one slit located between the latching protrusions spaced apart from each other at regular intervals in the first direction.

For example, the plurality of levers may be made of an insulating material.

For example, the at least one slit may include a plurality of slits, the plurality of latching protrusions may have a constant thickness in the first direction, and the plurality of slits may have a constant width in the first direction.

BRIEF DESCRIPTION OF THE DRAWINGS

Arrangements and embodiments may be described in detail with reference to the following drawings in which like reference numerals refer to like elements and wherein.

DETAILED DESCRIPTION OF ILLUSTRATIVE EMBODIMENTS

Figure 1:
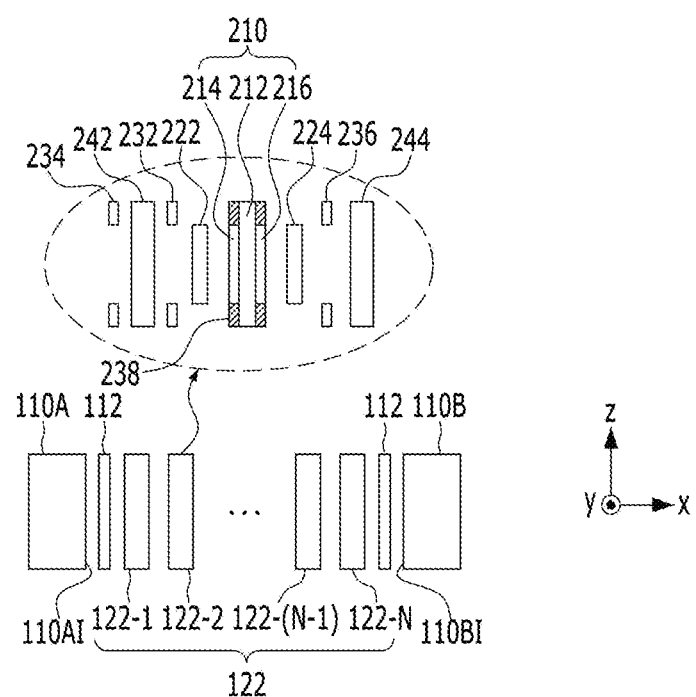
FIG. 1 is a cross-sectional view of end plates and a cell stack of a fuel cell.

The present disclosure will now be described more fully hereinafter with reference to the accompanying drawings, in which various embodiments are shown.

The examples, however, may be embodied in many different forms and should not be construed as being limited to the embodiments set forth herein. Rather, these embodiments are provided so that this disclosure will be more thorough and complete, and will more fully convey the scope of the disclosure to those skilled in the art.

It will be understood that when an element is referred to as being "on" or "under" another element, it may be directly on/under the element, or one or more intervening elements may also be present.

When an element is referred to as being "on" or "under", "under the element" as well as "on the element" may be included based on the element.

In addition, relational terms, such as "first", "second", "on/upper part/above" and "under/lower part/below", are used only to distinguish between one subject or element and another subject or element, without necessarily requiring or involving any physical or logical relationship or sequence between the subjects or elements.

Hereinafter, a cell-monitoring connector configured to be detachably mounted to a fuel cell according to embodiments and a comparative example will be described with reference to the accompanying drawings. The cell-monitoring connector configured to be detachably mounted to a fuel cell will be described using the Cartesian coordinate system (x, y, z) for convenience of description. However, other different coordinate systems may be used. In the drawings, an x-axis, a y-axis, and a z-axis of the Cartesian coordinate system are perpendicular to each other. However, the disclosure is not limited thereto. That is, the x-axis, the y-axis, and the z-axis may intersect each other. In the following description, the term "first direction" refers to at least one of the +x-axis direction or the −x-axis direction, the term "second direction" refers to at least one of the +y-axis direction or −y-axis direction, and the term "third direction" refers to at least one of the +z-axis direction or the −z-axis direction. The first, second and third directions may be perpendicular to each other, or may intersect each other.

A fuel cell, to which a cell-monitoring connector according to the embodiment is detachably mounted, may be, for example, a polymer electrolyte membrane fuel cell (or a proton exchange membrane fuel cell) (PEMFC), which has been studied most extensively as a power source for driving vehicles.

The fuel cell may include end plates (pressing plates or compression plates) (not shown) and a cell stack (not shown).

Hereinafter, an example of the cell stack will be described with reference to FIG. 1. However, a cell-monitoring connector according to embodiments may be applied without being limited as to the specific type of a fuel cell or a cell stack.

FIG. 1 is a cross-sectional view of the end plates and the cell stack of the fuel cell.

The cell stack 122 may include a plurality of unit cells 122-1 to 122-N, which are stacked in the first direction. Here, "N" is a positive integer of 1 or greater, and may range from several tens to several hundreds. "N" may range, for example, from 100 to 300, and preferably may be 220. However, the disclosure is not limited to any specific value of "N".

Each unit cell 122-$n$ (where $1 \leq n \leq N$) may generate 0.6 volts to 1.0 volts of electricity, on average 0.7 volts of electricity. Thus, "N" may be determined in accordance with the intensity of the power to be supplied from the fuel cell to a load. Here, "load" may refer to a part of a vehicle that requires power when the fuel cell is used in the vehicle.

Each unit cell 122-$n$ may include a membrane electrode assembly (MEA) 210, gas diffusion layers (GDLs) 222 and 224, gaskets 232, 234 and 236, and separators (or bipolar plates) 242 and 244.

The membrane electrode assembly 210 has a structure in which catalyst electrode layers, in which electrochemical reaction occurs, are attached to both sides of an electrolyte membrane through which hydrogen ions move. Specifically, the membrane electrode assembly 210 may include a polymer electrolyte membrane (or a proton exchange membrane) 212, a fuel electrode (a hydrogen electrode or an anode) 214, and an air electrode (an oxygen electrode or a cathode) 216. In addition, the membrane electrode assembly 210 may further include a sub-gasket 238.

The polymer electrolyte membrane 212 is disposed between the fuel electrode 214 and the air electrode 216.

Hydrogen, which is the fuel in the fuel cell, may be supplied to the fuel electrode 214 through the first separator 242, and air containing oxygen as an oxidizer may be supplied to the air electrode 216 through the second separator 244.

The hydrogen supplied to the fuel electrode 214 is decomposed into hydrogen ions (protons) (H+) and electrons (e−) by the catalyst. Only the hydrogen ions may be selectively transferred to the air electrode 216 through the polymer electrolyte membrane 212, and at the same time, the electrons may be transferred to the air electrode 216 through the separators 242 and 244, which are conductors. In order to realize the above operation, a catalyst layer may be applied to each of the fuel electrode 214 and the air electrode 216. The movement of the electrons described above causes the electrons to flow through an external wire, thus generating current. That is, the fuel cell may generate power due to the electrochemical reaction between hydrogen, which is fuel, and oxygen contained in the air.

In the air electrode 216, the hydrogen ions supplied through the polymer electrolyte membrane 212 and the electrons transferred through the separators 242 and 244 meet oxygen in the air supplied to the air electrode 216, thus causing a reaction that generates water ("condensate water" or "product water").

In some cases, the fuel electrode 214 may be referred to as an anode, and the air electrode 216 may be referred to as a cathode. Alternatively, the fuel electrode 214 may be referred to as a cathode, and the air electrode 216 may be referred to as an anode.

The gas diffusion layers 222 and 224 serve to uniformly distribute hydrogen and oxygen, which are reaction gases, and to transfer the generated electric energy. To this end, the gas diffusion layers 222 and 224 may be disposed on respective sides of the membrane electrode assembly 210. That is, the first gas diffusion layer 222 may be disposed on the left side of the fuel electrode 214, and the second gas diffusion layer 224 may be disposed on the right side of the air electrode 216.

The first gas diffusion layer 222 may serve to diffuse and uniformly distribute hydrogen supplied as a reactant gas through the first separator 242, and may be electrically conductive. The second gas diffusion layer 224 may serve to diffuse and uniformly distribute air supplied as a reactant gas through the second separator 244, and may be electrically conductive.

Each of the first and second gas diffusion layers 222 and 224 may be a microporous layer in which fine carbon fibers are combined. However, the disclosure is not limited to any specific configuration of the first and second gas diffusion layers 222 and 224.

The gaskets 232, 234 and 236 may serve to maintain the airtightness and clamping pressure of the cell stack at an appropriate level with respect to the reactant gases and the coolant, to disperse the stress when the separators 242 and 244 are stacked, and to independently seal the flow paths. As such, since airtightness and watertightness are maintained by the gaskets 232, 234 and 236, the flatness of the surfaces that are adjacent to the cell stack 122, which generates power, may be secured, and thus surface pressure may be distributed uniformly over the reaction surface of the cell stack 122. To this end, the gaskets 232, 234 and 236 may be formed of rubber. However, the disclosure is not limited to any specific material of the gaskets.

The separators 242 and 244 may serve to move the reactant gases and the cooling medium and to separate each of the unit cells from the other unit cells. In addition, the separators 242 and 244 may serve to structurally support the membrane electrode assembly 210 and the gas diffusion layers 222 and 224 and to collect the generated current and transfer the collected current to the current collectors 112.

The separators 242 and 244 may be disposed outside the gas diffusion layers 222 and 224, respectively. That is, the first separator 242 may be disposed on the left side of the first gas diffusion layer 222, and the second separator 244 may be disposed on the right side of the second gas diffusion layer 224.

The first separator 242 serves to supply hydrogen as a reactant gas to the fuel electrode 214 through the first gas diffusion layer 222. The second separator 244 serves to supply air as a reactant gas to the air electrode 216 through the second gas diffusion layer 224. In addition, each of the first and second separators 242 and 244 may form a channel through which a cooling medium (e.g. coolant) may flow. Further, the separators 242 and 244 may be formed of a graphite-based material, a composite graphite-based material, or a metal-based material. However, the disclosure is not limited to any specific material of the separators 242 and 244.

The end plates 110A and 110B shown in FIG. 1 may be disposed at the respective ends of the cell stack 122, and may support and fix the unit cells 122-1 to 122-N. That is, the first end plate 110A may be disposed at one end of the cell stack 122, and the second end plate 110B may be disposed at the opposite end of the cell stack 122.

Each of the end plates 110A and 110B may be configured such that a metal insert is surrounded by a plastic injection-molded product. The metal insert of each of the end plates 110A and 110B may have high rigidity to withstand internal surface pressure, and may be formed by machining a metal material. For example, each of the end plates 110A and 110B may be formed by combining a plurality of plates. However, the disclosure is not limited to any specific configuration of the end plates 110A and 110B.

The current collectors 112 may be disposed between the cell stack 122 and the inner surfaces 110AI and 110BI of the end plates 110A and 110B that face the cell stack 122. The current collectors 112 serve to collect the electric energy generated by the flow of electrons in the cell stack 122 and to supply the electric energy to a load that uses the fuel cell.

Further, the first end plate 110A may include a plurality of manifolds (or communicating portions) M. Each of the first and second separators 242 and 244 shown in FIG. 1 may include manifolds that are formed in the same shape at the same positions as the manifolds of the first end plate 110A. Here, the manifolds may include an inlet manifold and an outlet manifold. Hydrogen and oxygen, which are reactant gases necessary in the membrane electrode assembly 210, may be introduced from the outside into the cell stack 122 through the inlet manifold. Gas or liquid, in which the reactant gases humidified and supplied to the cell and the condensate water generated in the cell are combined, may be discharged to the outside of the fuel cell through the outlet manifold. The cooling medium may flow from the outside into the cell stack 122 through the inlet manifold and may flow from the cell stack 122 to the outside through the outlet manifold. As described above, the manifolds allow the fluid to flow into and out of the membrane electrode assembly 210.

In order to determine the performance and failure of the cell stack 122, the separators 242 and 244 of each cell may be connected to a control circuit using a cell-monitoring connector and a wire so as to measure the voltage of each cell. Here, the control circuit may refer to a circuit including a measurement device and an electronic control unit for operating the fuel cell in a vehicle.

Hereinafter, a cell-monitoring connector (hereinafter, referred to as a "connector") 300 for checking the state (e.g. the voltage) of each unit cell included in the fuel cell and the fuel cell to which the connector 300 is detachably mounted according to the embodiment will be described with reference to the accompanying drawings.

Figure 2:
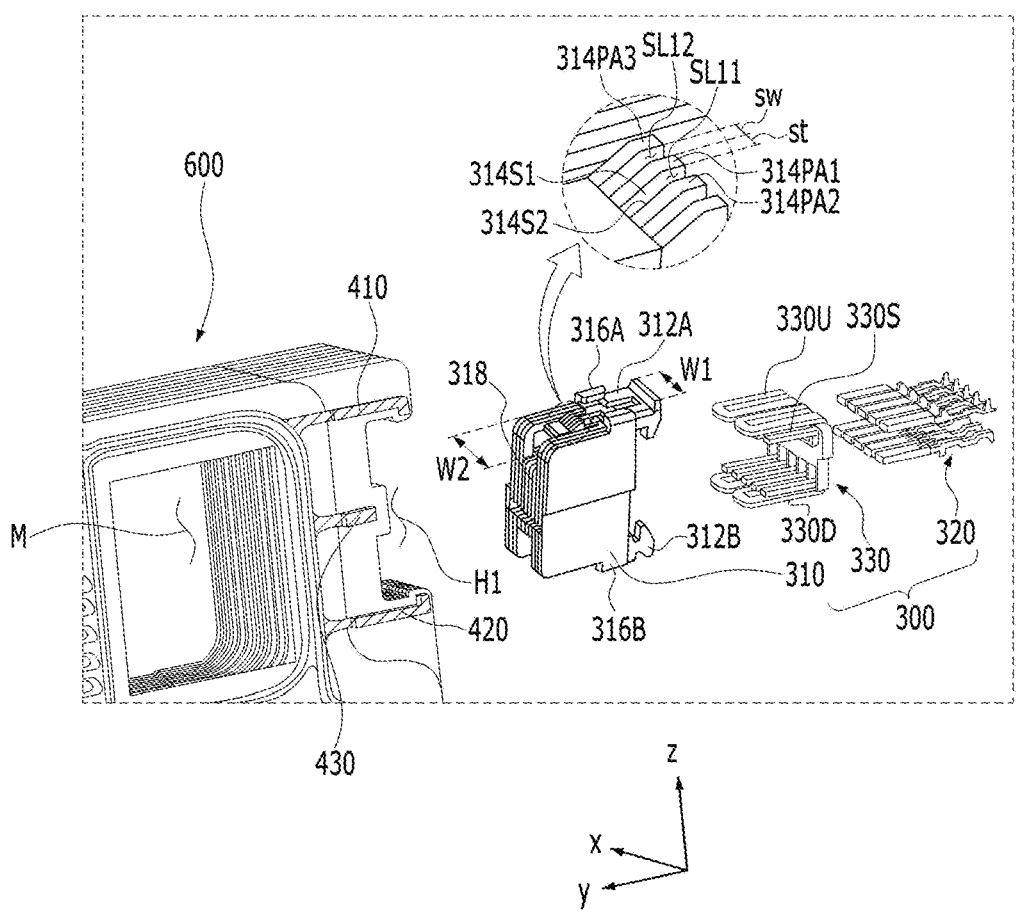
FIG. 2 is an exploded perspective view of a cell-monitoring connector and separators included in the fuel cell according to the embodiment.
Figure 3:
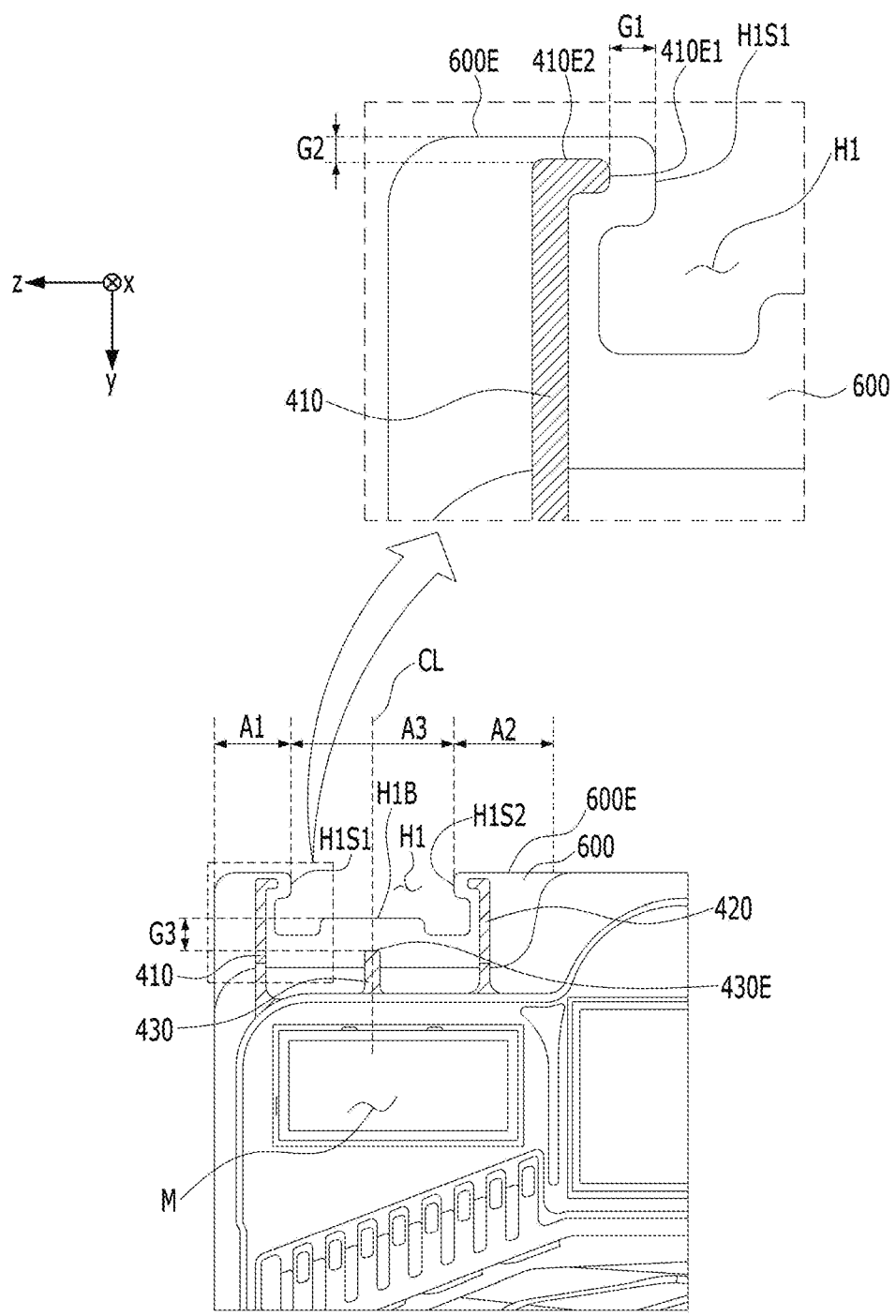
FIG. 3 is a cross-sectional view taken when the separators shown in FIG. 2 are viewed in a first direction.
Figure 4A:
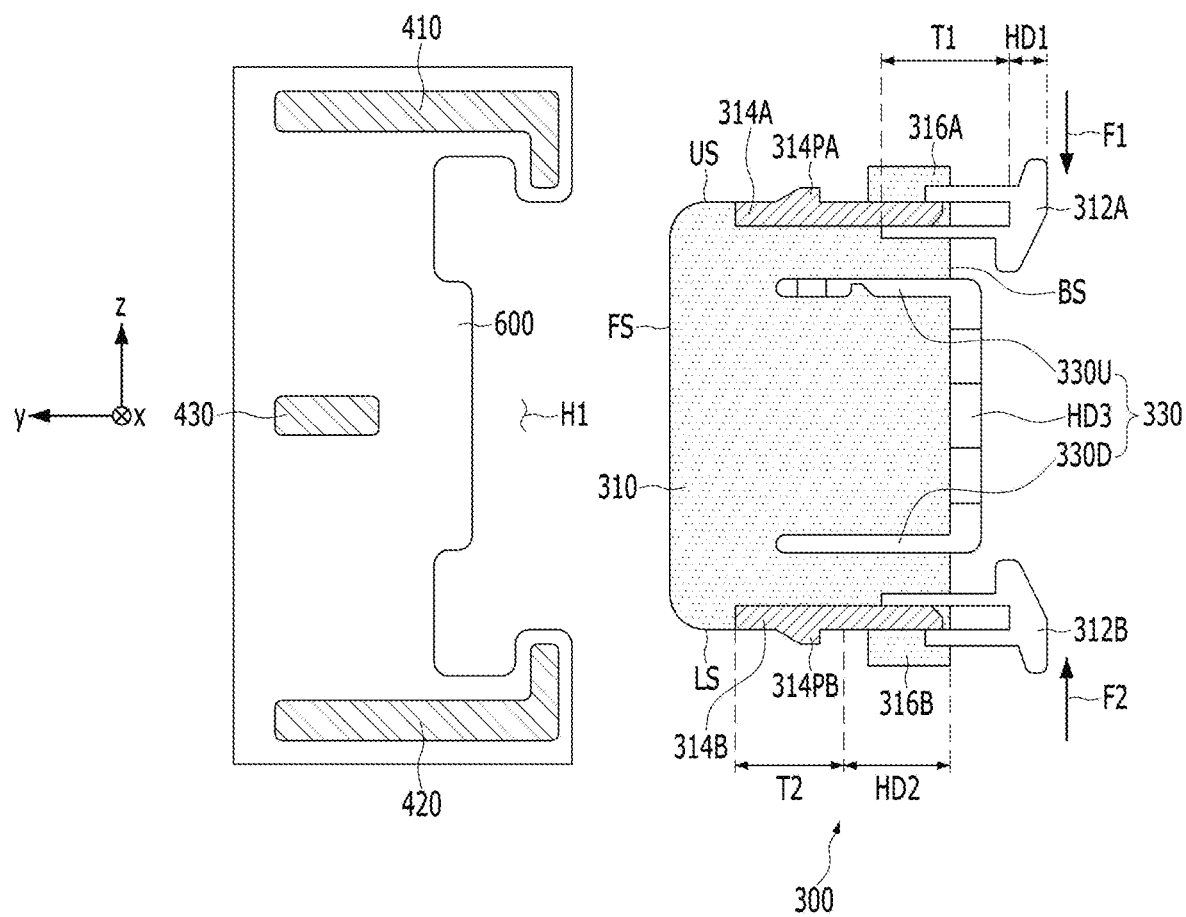
FIGS. 4A and 4B are exploded cross-sectional views of the separators and the cell-monitoring connector.
Figure 4B:
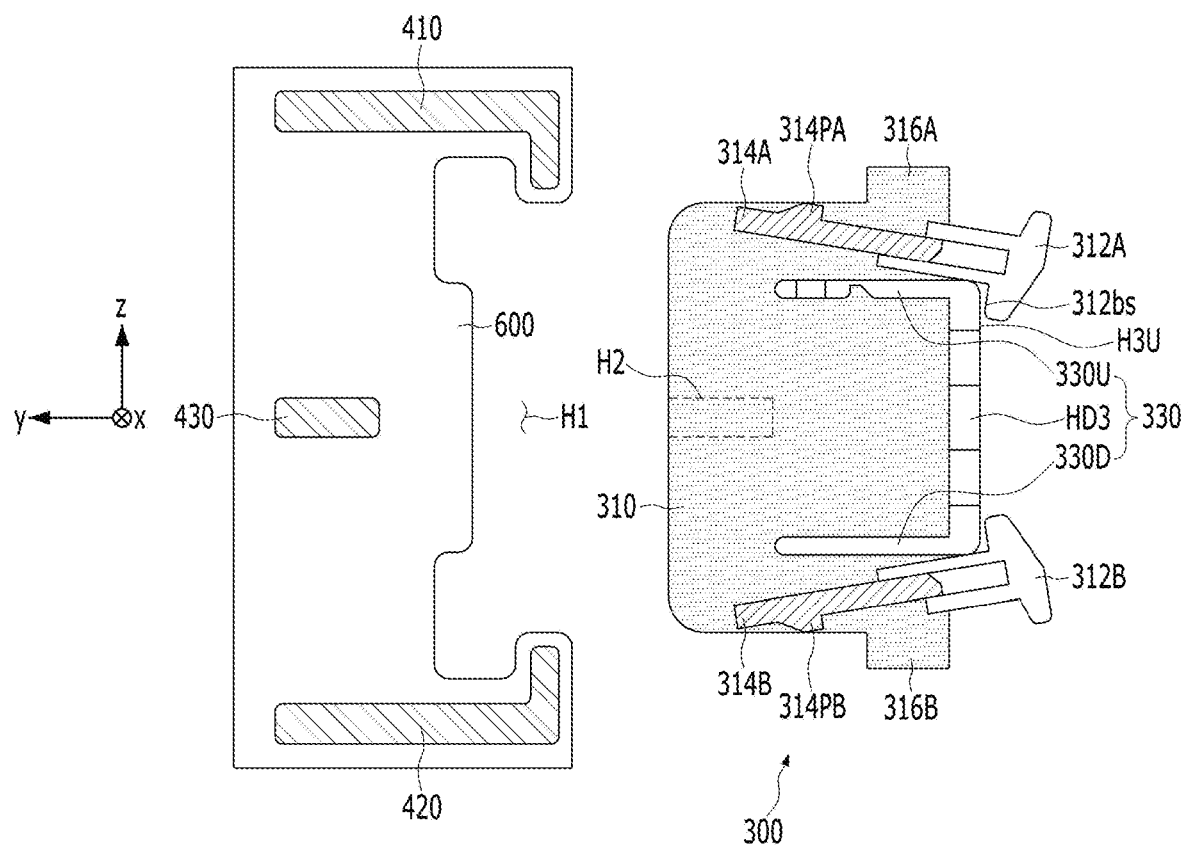

FIG. 2 is an exploded perspective view of the cell-monitoring connector 300 and the separators 600 included in the fuel cell according to the embodiment, FIG. 3 is a cross-sectional view taken when the separators 600 shown in FIG. 2 are viewed in the first direction, and FIGS. 4A and 4B are exploded cross-sectional views of the separators 600 and the cell-monitoring connector 300.

For convenience of description, FIGS. 2 to 4B show only the separators 600, latching parts 410 and 420, and a shift-preventing part 430, which are parts of the fuel cell to which the connector 300 according to the embodiment may be detachably mounted. In the fuel cell to which the connector 300 according to the embodiment may be detachably mounted, components other than the separators 600, the latching parts 410 and 420 and the shift-preventing part 430 may be embodied in various configurations, and the disclosure is not limited to any specific configuration of the other components.

The separators 600 may correspond to the separators 242 and 244 shown in FIG. 1, and the latching parts 410 and 420 may correspond to the gaskets 232, 234 and 236 shown in FIG. 1. Alternatively, the latching parts 410 and 420 may be separate gaskets that diverge from the gaskets 232, 234 and 236 shown in FIG. 1. Hereinafter, the latching parts 410 and 420 will be described as being implemented as the gaskets. However, the following description may also be applied to the case in which the latching parts 410 and 420 are implemented as separate members other than the gaskets.

The separators 600 may be disposed so as to be spaced apart from each other in the first direction. Each of the separators 600 includes a receiving recess H1 formed in the side thereof. The receiving recess H1 may have a shape that is recessed inwards from the outer edge 600E of each of the separators 600.

The receiving recess H1 may include a first side surface H1S1, a second side surface H1S2, and a lower surface H1B.

The first side surface H1S1 and the second side surface H1S2 may be opposite each other in the third direction, and may extend from the lower surface H1B in a direction parallel to the second direction. The lower surface H1B may be formed between the first side surface H1S1 and the second side surface H1S2, and may be opposite a housing 310 of the connector 300 when the housing 310 is fitted into the receiving recess H1. The first side surface H1S1, the second side surface H1S2, and the lower surface H1B may define the receiving recess H1.

The separators 600 included in the cell stack 122 may constitute some of all of the separators included in the fuel cell. For example, all of the separators included in the fuel cell may be grouped into a plurality of unit groups, and each unit group may be constituted by at least one separator 600 or a plurality of separators 600. For example, the unit group shown in FIG. 2 may include ten separators 600. In this case, the connector 300 may be provided for each unit group of the fuel cell. The connector 300 may be fastened (attached, coupled, inserted, mounted, or assembled) to the fuel cell or may be demounted (separated or disassembled) from the fuel cell.

In addition, the first and second side surfaces H1S1 and H1S2 and the lower surface H1B, defining the receiving recess H1 of each of the separators 600 may be disposed so as to overlap each other in the first direction. The receiving recesses H1 formed in the separators 600 belonging to the unit group define a receiving space into which the connector 300 is fitted. That is, the receiving recesses H1 disposed in the first direction form the receiving space.

The latching pails may be disposed on opposite surfaces (e.g. 600S1 and 600S2 shown in FIG. 8, which will be described later) of each of the separators 600 so as to be located around the receiving recess H1, and may have a hook shape. Here, the hook shape is a shape by which the latching protrusions 314PA and 314PB shown in FIGS. 4A and 4B (which will be described later) may be latched. As shown in FIGS. 2 to 4B, the hook shape may be an "L" shape, but the disclosure is not limited thereto.

For example, the gaskets, which serve as the latching parts, may include first and second gaskets 410 and 420. The first and second gaskets 410 and 420 may be disposed so as to be opposite each other in the third direction, which is the direction in which external force is applied to lever operators to be described later with respect to the receiving recess H1.

The hook shapes of the first and second gaskets 410 and 420 may be symmetrical to each other with respect to the receiving recess H1. For example, referring to FIG. 3, the "L" shapes of the first and second gaskets 410 and 420 may be symmetrical to each other in the third direction with respect to the center line CL of the receiving recess H1.

A first end of each of the first and second gaskets 410 and 420, which faces the receiving recess H1, may be spaced apart from the receiving recess H1, and a second end of each of the first and second gaskets 410 and 420, which faces the outer edge 600E of each separator 600, may be spaced apart from the outer edge 600E. For example, the first end 410E1 of the first gasket 410, which faces the receiving recess H1, may be spaced apart from the first side surface H1S1 of the receiving recess H1 by a first gap G1, and the second end 410E2 of the first gasket 410, which faces the outer edge 600E of each separator 600, may be spaced apart from the outer edge 600E by a second gap G2.

If the first and second ends 410E1 and 410E2 of the first gasket 410 are disposed so as to be contiguous with the first side surface H1S1 of the receiving recess H1 and the outer edge 600E without being respectively spaced apart therefrom, or if the first and second ends of the second gasket 420 are disposed so as to be contiguous with the second side surface H1S2 of the receiving recess H1 and the outer edge 600E without being respectively spaced apart therefrom, the first and second gaskets 410 and 420 may invade the receiving recess H1, or may protrude outwards from the outer edge 600E. Further, the process of manufacturing the first and second gaskets 410 and 420 in a manner that avoids the above problem may be complicated. Therefore, according to the embodiment, the first and second ends of each of the first and second gaskets 410 and 420 are respectively spaced apart from the receiving recess H1 and the outer edge 600E by the first and second gaps G1 and G2, thereby preventing the above problem.

In addition, each of opposite surfaces of each separator 600 may include first to third regions A1 to A3, which surround the receiving recess H1. The first region A1 is a region in which the first gasket 410 is formed, and is a region that is contiguous with the first side surface H1S1 of the receiving recess H1. The second region A2 is a region in which the second gasket 420 is formed, and is a region that is contiguous with the second side surface H1S2 of the receiving recess H1 while being opposite the first region A1 in the third direction. The third region A3 is a region that is contiguous with the lower surface H1B of the receiving recess H1 between the first region A1 and the second region A2. Each of the first side surface H1S1 and the second side surface H1S2, as shown in FIG. 3, may have a shape that is recessed in the third direction, but the disclosure is not limited thereto. According to another embodiment, unlike the configuration shown in FIG. 3, neither the first side surface H1S1 nor the second side surface H1S2 may have a recessed shape.

The fuel cell according to the embodiment may further include a shift-preventing part. The shift-preventing part may be disposed near the lower surface H1B of the receiving recess H1 in the third region A3 of the separator 600. The shift-preventing part may be implemented by the gasket. In this case, the fuel cell according to the embodiment may further include a third gasket 430 for implementing the shift-preventing part. The third gasket 430 may be formed in the third region A3 so as to extend in a direction (e.g. the second direction) that intersects the direction (e.g. the third direction) in which the connector 300 may undesirably shift. Referring to the drawings, the third gasket 430 may be disposed in a thin and long straight line (-) shape in the direction (e.g. the second direction) in which the housing 310 of the connector 300 is inserted, and may be formed in the shape of a protrusion that protrudes in the first direction.

The housing 310 may include a shift-preventing groove H2 formed therein to allow the shift-preventing part (e.g. the third gasket 430) disposed on each separator 600 to be inserted thereinto in the second direction. Although the shift-preventing groove H2 is not visible from the outside, the shift-preventing groove H2 is indicated by the dotted lines in FIG. 4B in order to promote an understanding of the embodiment. As such, when the third gasket 430 is inserted into the shift-preventing groove H2, the connector 300 coupled to the fuel cell may be prevented from shifting in the third direction.

When the fuel cell is installed in a vehicle, if the connector 300 shakes in the third direction due to vibration and impact caused by travel of the vehicle, it is not possible to accurately measure the voltage value. That is, the measured voltage value changes unstably, and thus the reliability of the measured value is lowered. The connector 300 may, in the worst case, be separated from the separators 600. However, according to the embodiment, the connector 300 is prevented from shifting in the third direction by the third gasket 430, which serves as the shift-preventing part, and the shift-preventing groove H2, thus preventing the above problem.

In addition, a third end 430E of the third gasket 430, which faces the lower surface H1B of the receiving recess H1, may be spaced apart from the lower surface H1B of the receiving recess H1 by a third gap G3.

The first to third gaps G1, G2 and G3 may be the same as or different from each other.

If the third end 430E of the third gasket 430 is disposed so as to be contiguous with the lower surface H1B of the receiving recess H1 without being spaced apart therefrom, the third gasket 430 may invade the receiving recess H1 beyond the lower surface H1B of the receiving recess H1. Thus, the process of manufacturing the third gasket 430 in a manner that avoids the above problem may be complicated. Therefore, according to the embodiment, the third end 430E of the third gasket 430 is spaced apart from the lower surface H1B of the receiving recess H1 by the third gap G3, thereby preventing the above problem.

In some cases, the shift-preventing part (e.g. the third gasket 430) and the shift-preventing groove H2 may be omitted from the fuel cell.

Hereinafter, the configuration of the connector 300 according to the embodiment, which is capable of being detachably mounted to the fuel cell, will be described in detail.

As shown in FIGS. 2, 4A and 4B, the connector 300 may include the housing 310, lever operators 312A and 312B, levers 314A and 314B, and connection terminals 320.

Hereinafter, the connector 300 will be described as including a pair of lever operators 312A and 312B. However, the following description may also be applied to the case in which the connector 300 includes only one of the lever operators 312A and 312B.

Figure 10A:
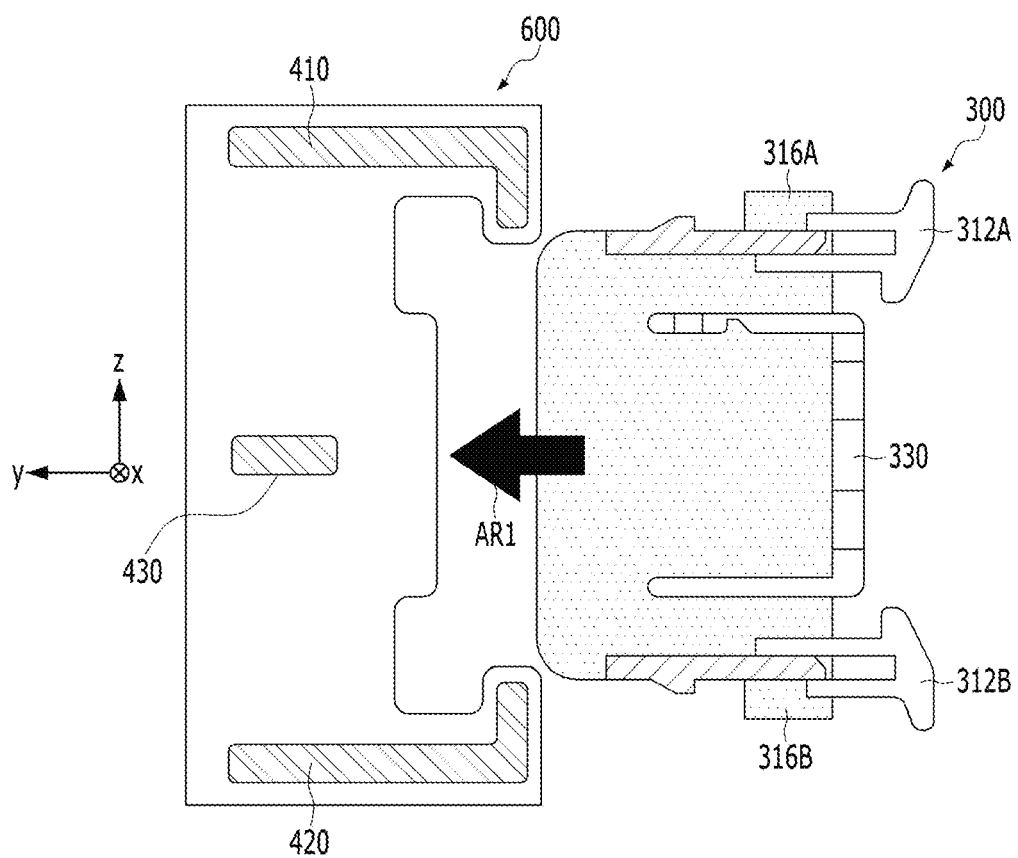
FIGS. 10A to 10D are cross-sectional views for explaining the process in which the cell-monitoring connector according to the embodiment is mounted in a receiving space in the fuel cell.
Figure 10B:
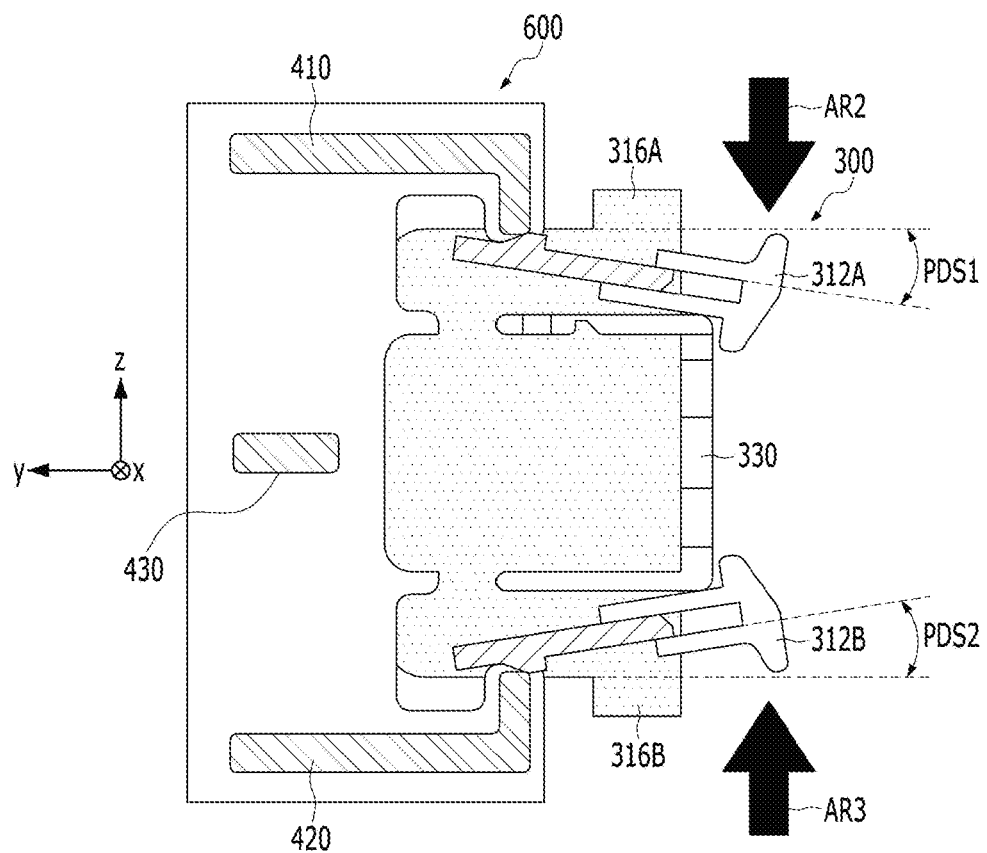
Figure 10C:
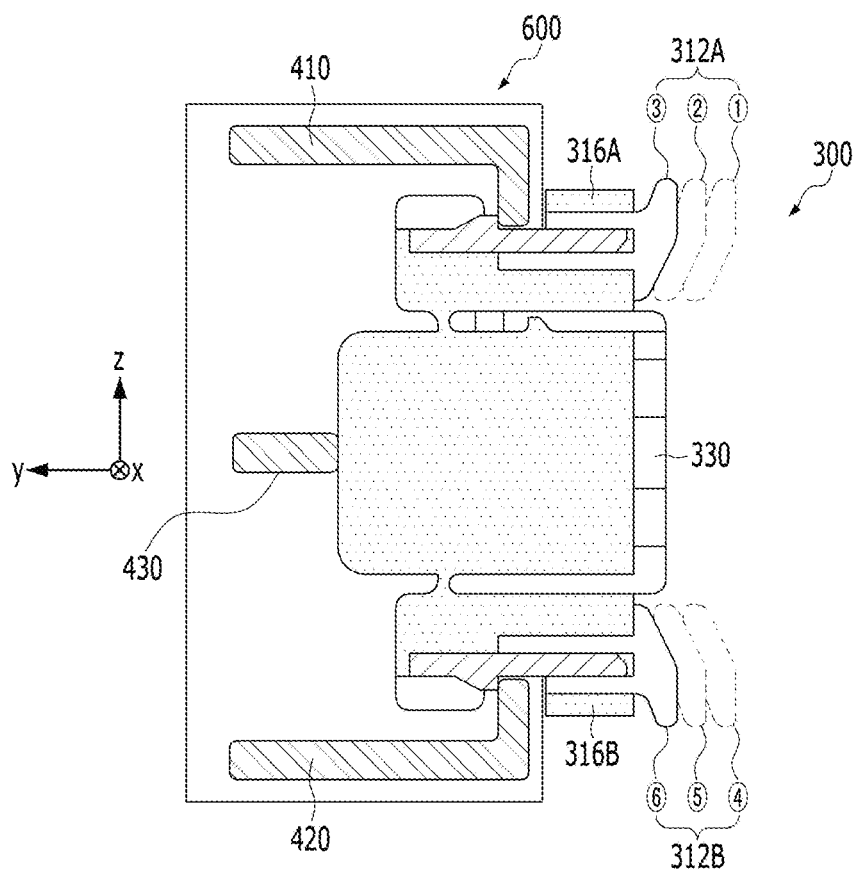

At least a portion of the housing 310 may be received in the receiving space, which is defined by the receiving recesses H1 in the separators 600 included in a unit group, as shown in FIG. 10C to be described later. The housing 310 may be inserted into the receiving space formed by the receiving recesses H1 arranged in the first direction, and thus at least a portion of the housing 310 may be received in the receiving space.

The housing 310 may include a front surface FS, a back surface BS, an upper surface US, and a lower surface LS. The front surface FS of the housing 310 may be a surface that faces the lower surface H1B of the receiving recess H1 before the housing 310 is inserted into the receiving space, the rear surface BS may be a surface that is opposite the front surface FS, and the upper surface US and the lower surface LS may be surfaces that are opposite each other in the third direction between the front surface FS and the back surface BS.

In addition, the housing 310 may include a plurality of slits (hereinafter, referred to as "first slits") 318, which are formed in the front surface FS thereof. The separators 600, located on the lower surfaces H1B of the receiving recesses H1 forming the receiving space, may be fitted into the respective first slits 318. Unlike the configuration shown in the drawings, the first slits 318 may be divided into two sections that are opposite each other in the third direction. Among the separators 600, the odd-numbered (or even-numbered) separators may be fitted into one of the two sections, and the even-numbered (or odd-numbered) separators may be fitted into the other one of the two sections. As such, when the neighboring separators 600 are alternately fitted into the respective sections different from each other of the first slits 318, the sizes of gaps in the first direction between the neighboring separators 600 may be reduced. However, the disclosure is not limited thereto. As shown in the drawings, the first slits 318 may include only one section to which the separators 600 are sequentially fitted.

The first and second lever operators 312A and 312B may be disposed opposite each other and spaced apart from each other in a direction (e.g. the third direction) that intersects the direction (e.g. the first direction) in which the separators 600 are stacked and the direction (e.g. the second direction) in which the connector 300 is inserted into the fuel cell. Each of the first and second lever operators 312A and 312B is movable in the third direction that intersects the first and second directions due to pressure (hereinafter, referred to as "first external pressure") by external force, and at least a portion thereof may be coupled to the housing 310. For example, each of the first and second lever operators 312A and 312B may be implemented as a locking device made of plastic, which is called a connector position assurance (CPA).

The levers may be disposed in the housing 310 so as to be respectively coupled to the first and second lever operators 312A and 312B. For example, a plurality of levers may be coupled to a single first lever operator 312A, and a plurality of levers may be coupled to a single second lever operator 312B.

In addition, each of the levers may include at least one latching protrusion. For example, referring to FIGS. 4A and 4B, one lever (hereinafter, referred to as a "first lever") 314A may include one latching protrusion 314PA, and the other lever (hereinafter, referred to as a "second lever") 314B may include one latching protrusion 314PB.

Referring to FIGS. 4A and 4B, the first lever operator 312A is shown as being coupled to one first lever 314A. However, a plurality of first levers 314A, disposed so as to be spaced apart from each other at regular intervals in the first direction, may be coupled to one first lever operator 312A. Similarly, referring to FIGS. 4A and 4B, the second lever operator 312B is shown as being coupled to one second lever 314B. However, a plurality of second levers 314B, disposed so as to be spaced apart from each other at regular intervals in the first direction, may be coupled to one second lever operator 312B.

Thus, the latching protrusions 314PA of the respective first levers 314A may also be spaced apart from each other at regular intervals in the first direction, and the latching protrusions 314PB of the respective second levers 314B may also be spaced apart from each other at regular intervals in the first direction. For example, referring to FIG. 2, it can be seen that a plurality of latching protrusions 314PA1, 314PA2 and 314PA3 is coupled to one first lever operator 312A.

Each of the separators 600 may be fitted into at least one slit (hereinafter, referred to as a "second slit") located between the latching protrusions spaced apart from each other at regular intervals in the first direction. Here, the second slit may be provided in a plural number.

For example, referring to FIG. 2, one of the separators 600 may be fitted into a second slit SL11 between the latching protrusions 314PA1 and 314PA2, and another of the separators 600 may be fitted into a second slit SL12 between the latching protrusions 314PA1 and 314PA3.

When the first and second levers 314A and 314B are made of an insulating material, two opposite inner surfaces (e.g. 314S1 and 314S2) of the latching protrusions (e.g. 314PA1 and 314PA2) that are adjacent to each other so as to form the second slit SL11 may be insulative. To this end, the housing 310 including the latching protrusions (e.g. 314PA1, 314PA2 and 314PA3) may be implemented in the form of a plastic injection-molded product that is insulative. However, the disclosure is not limited to any specific material of the housing 310.

In general, each of the neighboring separators 600 is conductive. In this case, the latching protrusions 314PA1, 314PA2 and 314PA3, which are insulative, serve as insulators for electrically isolating the separators 600 fitted into the respective second slits SL11 and SL12 from each other, thereby preventing the risk of a short circuit between neighboring ones of the separators 600.

Further, the latching protrusions 314PA1, 314PA2 and 314PA3 may have the same thickness st in the first direction as each other, and the second slits SL11 and SL12 may have the same width sw in the first direction as each other. As such, since the thickness st are the same and the width sw are the same, the separators 600 may be disposed at regular or at the same intervals in the first direction, and thus the stacking tolerance in the first direction of the separators 600 may be compensated for. As a result, the arrangement state of the separators 600 included in the cell stack 122 is improved, and thus the receiving recesses H1, forming the receiving space, may be disposed without being out of alignment with each other. Accordingly, it is possible to easily assemble the connector 300 to the separators 600. In addition, when the connector 300 is mounted to the separators 600, it is possible to prevent the inner edge of the connector 300, which comes into contact with the first side surface H1S1, the second side surface H1S2, and the lower surface H1B of each receiving recess H1, from being distorted (deformed) or damaged.

The housing 310 may further include at least one damage-preventing part. The at least one damage-preventing part serves to prevent damage to the first and second lever operators 312A and 312B when the first and second lever operators 312A and 312B are operated in the direction opposite the direction in which the first external pressure is applied to the first and second lever operators 312A and 312B. After the first external pressure is applied to the first and second lever operators 312A and 312B and the connector 300 is thus inserted into the fuel cell, the at least one damage-preventing part may be disposed to restrict the movement of the first and second lever operators 312A and 312B.

To this end, the damage-preventing part may be disposed so as to protrude from the front end of the housing 310 in the direction opposite the direction in which the first external pressure is applied to the first and second lever operators 312A and 312B. However, the disclosure is not limited to any specific shape or position of the damage-preventing part.

For example, as shown in FIGS. 2, 4A and 4B, two damage-preventing parts 316A may be disposed so as to be adjacent to the first lever operator 312A and to be spaced apart from each other in the first direction at the front end of the upper surface US of the housing 310, and two damage-preventing parts 316B may be disposed so as to be adjacent to the second lever operator 312B and to be spaced apart from each other in the first direction at the front end of the lower surface LS of the housing 310. In particular, the damage-preventing parts may be useful when the connector 300 is for use in a narrow-pitch product.

As shown in FIG. 4A, the first lever operator 312A may be moved in the third direction (e.g. the −z-axis direction) by the first external pressure caused by external force F1 applied in the direction indicated by the arrow, and the second lever operator 312B may be moved in the +z-axis direction by the first external pressure caused by external force F2 applied in the direction indicated by the arrow. In this case, when the first external pressure caused by the external forces F1 and F2 is removed, the first and second lever operators 312A and 312B may be restored to the original positions thereof. To this end, the first and second lever operators 312A and 312B may be made of an elastic material. That is, the first lever operator 312A may have elasticity to be restored in the +z-axis direction when the first external pressure caused by the external force F1 is removed, and the second lever operator 312B may have elasticity to be restored in the −z-axis direction when the first external pressure caused by the external force F2 is removed.

Hereinafter, only the first and second levers 314A and 314B will be described. However, the plurality of levers coupled to the first lever operator 312A has the same structure and operates in the same manner as the first lever 314A, and the plurality of levers coupled to the second lever operator 312B has the same structure and operates in the same manner as the second lever 314B.

The at least one latching protrusion formed at each of the levers may operate in connection with the movement of each of the lever operators 312A and 312B, and may move between a first position at which it protrudes in the third direction from the outer surface of the housing 310 and a second position at which it does not protrude from the outer surface of the housing 310 so as to be caught by the latching parts 410 and 420 or to be released from the latching parts 410 and 420.

For example, when the first lever operator 312A moves in the third direction (e.g. the −z-axis direction), the latching protrusion 314PA may move from the first position at which it protrudes from the outer surface of the housing 310 to the second position at which it is located inside the housing 310 without protruding from the outer surface of the housing 310.

In addition, when the second lever operator 312B moves in the third direction (e.g. the +z-axis direction), the latching protrusion 314PB may move from the first position at which it protrudes from the outer surface of the housing 310 to the second position at which it is located inside the housing 310 without protruding from the outer surface of the housing 310.

For example, as shown in FIG. 4A, the first position is a position at which the latching protrusion 314PA of the first lever 314A is in the state of protruding from the outer surface of the housing 310, specifically the upper surface US of the housing 310. In addition, as shown in FIG. 4B, the second position is a position at which the latching protrusion 314PA of the first lever 314A is in the state of being located inside the housing 310 without protruding from the upper surface US of the housing 310.

Similarly, as shown in FIG. 4A, the first position is a position at which the latching protrusion 314PB of the second lever 314B is in the state of protruding from the outer surface of the housing 310, specifically the lower surface LS of the housing 310. In addition, as shown in FIG. 4B, the second position is a position at which the latching protrusion 314PB of the second lever 314B is in the state of being located inside the housing 310 without protruding from the lower surface LS of the housing 310.

As described above, the outer surface of the housing 310, from which the latching protrusions 314PA and 314PB protrude when they are located at the first position, may be at least one of the upper surface US or the lower surface LS of the housing 310.

In addition, according to the embodiment, each of the first and second lever operators 312A and 312B may include a first head portion HD1 and a first tail portion T1.

The first head portion HD1 may be a portion that receives the first external pressure. The first head portion HD1 may include a surface (hereinafter, referred to as a "touch surface") touched by a worker who applies external force to mount the connector 300 to the fuel cell. The first tail portion T1 may be a portion that extends from the first head portion HD1 in the second direction in which the connector 300 is inserted into the fuel cell and is connected to a corresponding one of the first and second levers 314A and 314B.

As shown in FIG. 2, the first head portion HD1 has a first width W1 in the first direction, and the connector 300 has a second width W2 in the first direction. For example, the first width W1 and the second width W2 may be the same, but the disclosure is not limited thereto.

Each of the first and second levers 314A and 314B may include a second head portion HD2 and a second tail portion T2. The second head portion HD2 may be a portion that is connected to the first tail portion T1, and the second tail portion T2 may be a portion that extends from the second head portion HD2 and is provided with a corresponding one of the latching protrusions 314PA and 314PB.

Figure 5A:
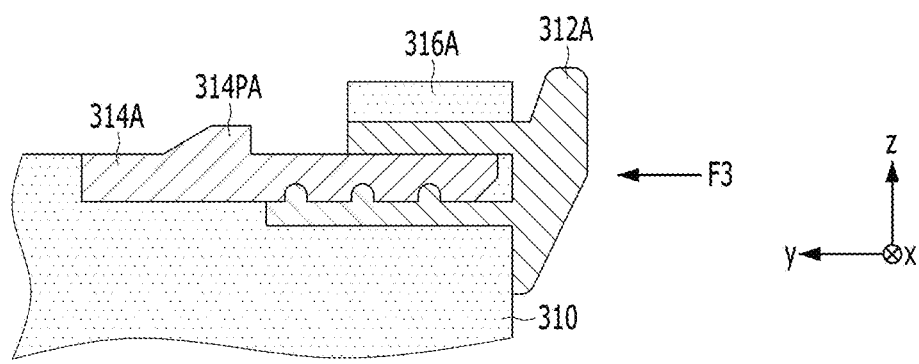
FIGS. 5A and 5B are cross-sectional views for explaining the linear motion of a first lever operator.
Figure 5B:
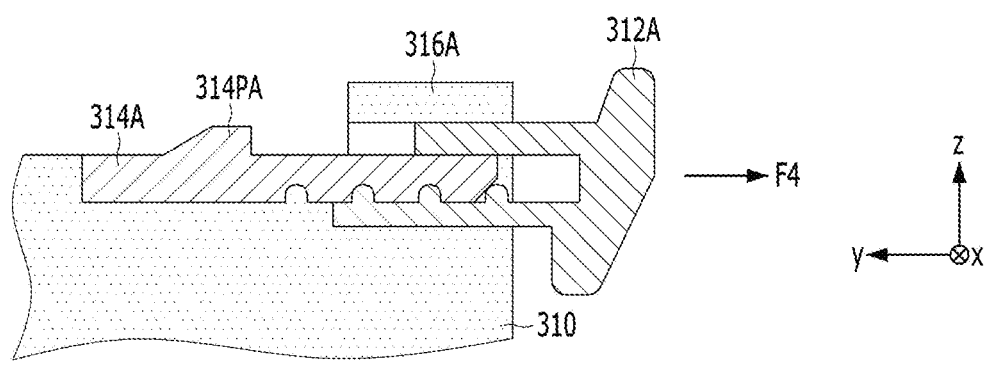

FIGS. 5A and 5B are cross-sectional views for explaining the linear motion of the first lever operator 314A. Although not shown, the second lever operator 314B may perform the same linear motion as the first lever operator 314A.

The first lever operator 312A may be coupled to the first lever 314A so as to be linearly movable in the second direction (e.g. the +y-axis direction or the −y-axis direction) between an introduced position and a withdrawn position through external pressure (hereinafter, referred to as "second external pressure") caused by external forces F3 and F4 applied in the second direction, which is different from the third direction, in which the external forces F1 and F2 shown in FIG. 4A are applied. In this case, the first lever operator 312A may be coupled to the first lever 314A in a variable fitting manner. Here, "fitting" may refer to press fit or snap fit, and "variable fitting" may refer to a coupling method in which the coupled state of components fitted to each other is capable of being varied.

The introduced position, as shown in FIG. 5A, is the position of the first lever operator 312A after the first lever operator 312A is pressed in the +y-axis direction by the second external pressure caused by the external force F3 applied in the +y-axis direction. The withdrawn position, as shown in FIG. 5B, is the position of the first lever operator 312A after the first lever operator 312A is pulled out in the −y-axis direction by the second external pressure caused by the external force F4 applied in the −y-axis direction.

The first lever operator 312A may be linearly moved from the withdrawn position shown in FIG. 5B to the introduced position shown in FIG. 5A by the second external pressure caused by the external force F3. Alternatively, the first lever operator 312A may be linearly moved from the introduced position shown in FIG. 5A to the withdrawn position shown in FIG. 5B by the second external pressure caused by the external force F4 applied in the direction opposite the direction in which the external force F3 is applied.

Similar to the first lever operator 312A, the second lever operator 312B may also linearly move between the introduced position and the withdrawn position.

When the first lever operator 312A moves in the third direction, the first lever 314A may move in connection therewith. However, when the first lever operator 312A linearly moves in the second direction, the first lever 314A may remain stationary without moving in connection therewith. In addition, when the second lever operator 312B moves in the third direction, the second lever 314B may move in connection therewith. However, when the second lever operator 312B linearly moves in the second direction, the second lever 314B may remain stationary without moving in connection therewith.

In addition, the first and second lever operators 312A and 312B may be respectively fitted to the first and second levers 314A and 314B in any of various manners in order to realize linear motion.

Figure 6:
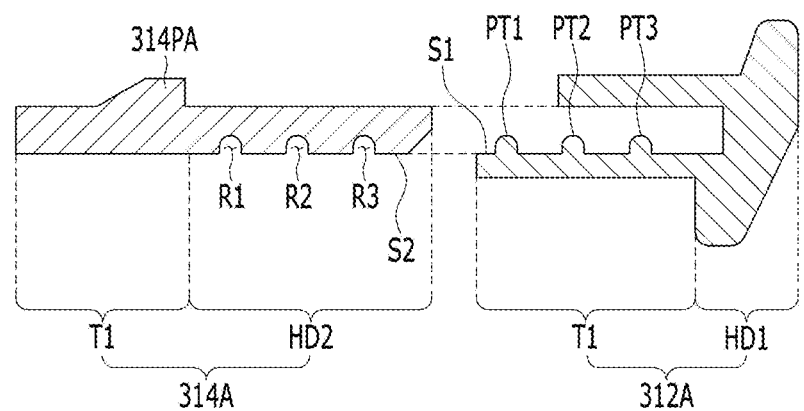
FIG. 6 is an exploded cross-sectional view of the first lever operator and a first lever, which may be fitted to each other according to the embodiment.

FIG. 6 is an exploded cross-sectional view of the first lever operator 312A and the first lever 314A, which may be fitted to each other according to the embodiment.

According to the embodiment, the first lever operator 312A and the first lever 314A may be fitted to each other with the configurations shown in FIG. 6. To this end, the first tail portion T1 of the first lever operator 312A may include a first surface S1 that faces the second head portion HD2 of the first lever 314A, and the second head portion HD2 may include a second surface S2 that faces the first surface S1.

One of the first surface S1 and the second surface S2 may have at least one recess, and the other one of the first surface S1 and the second surface S2 may have at least one projection, which has a shape corresponding to the shape of the at least one recess.

For example, as shown in FIGS. 5A to 6, the at least one recess may include a plurality of recesses R1, R2 and R3, and the at least one projection may include a plurality of projections PT1, PT2 and PT3. For example, the first surface S1 may have a plurality of projections PT1 to PT3 formed thereon, and the second surface S2 may have a plurality of recesses R1 to R3 formed therein, which have a shape corresponding to the shape of the projections PT1 to PT3.

Alternatively, according to another embodiment, unlike the configuration shown in FIGS. 5A to 6, the first surface S1 may have a plurality of recesses formed therein, and the second surface S2 may have a plurality of projections PT1 to PT3 formed thereon, which have a shape corresponding to the shape of the recesses.

When the first and second lever operators 312A and 312B linearly move in the second direction (e.g. the +y-axis direction or the −y-axis direction), the recesses R1 to R3 and the projections PT1 to PT3 may be fitted to each other by sliding manner. In this case, the degree to which the first and second lever operators 312A and 312B and the levers 314A and 314B are fitted to each other when the first and second lever operators 312A and 312B are located at the introduced position may be greater than when the first and second lever operators 312A and 312B are located at the withdrawn position. That is, the degree of fitting may vary depending on the position of the lever operators 312A and 312B.

For example, as shown in FIG. 5A, when the first lever operator 312A is located at the introduced position, all of the recesses R1 to R3 may be respectively fitted to all of the projections PT1 to PT3. As shown in FIG. 5B, when the first lever operator 312A is located at the withdrawn position, only some (e.g. R2 and R3) of the recesses may be respectively fitted to some (e.g. PT1 and PT2) of the projections, and the remaining one (e.g. R1) of the recesses may not be fitted to the remaining one (e.g. PT3) of the projections.

Although not shown, the second lever operator 312B may also be fitted to the second lever 314B in a sliding manner, similar to that shown in FIGS. 5A and 5B.

Figure 7:
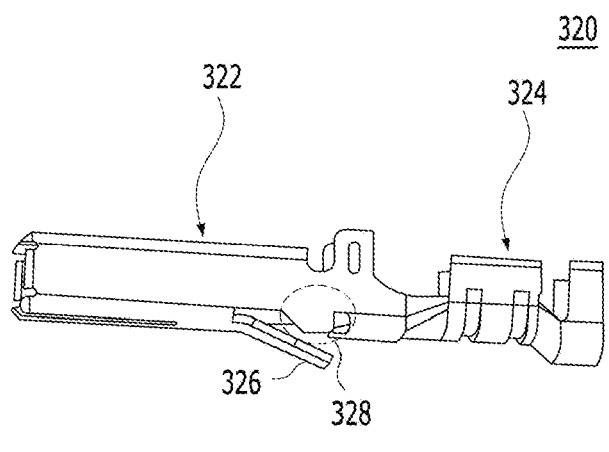
FIG. 7 is a perspective view of one example of the connection terminals shown in FIG. 2 according to the embodiment.
Figure 7:
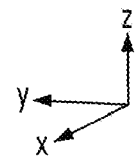
Figure 8:
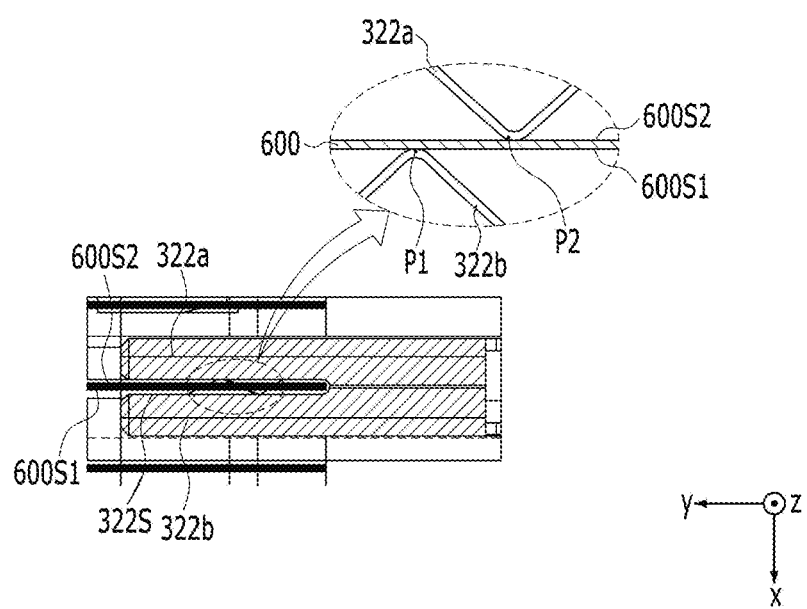
FIG. 8 is a plan view of one example of the connection terminals shown in FIG. 2 according to the embodiment.

FIGS. 7 and 8 are a perspective view and a plan view, respectively, of one of the connection terminals 320 shown in FIG. 2 according to the embodiment.

The connection terminals 320 may be inserted into connection terminal insertion holes in the housing 310, and may be connected to the respective separators 600. To this end, the housing 310 may include connection terminal insertion holes formed in the front surface thereof to communicate with the first slits 318.

Each of the connection terminals 320 may include a terminal connection portion 322 and a wire-holding portion 324. The terminal connection portion 322 is inserted into a corresponding connection terminal insertion hole to be connected to a corresponding separator 600. The wire-holding portion 324 extends from the terminal connection portion 322 and is wound by a wire (an electric wire) to hold the same.

The terminal connection portion 322 may include connection pieces 322a and 322b, which flexibly spread and contact opposite surfaces 600S1 and 600S2 of the separator 600. The connection points P1 and P2 of the connection pieces 322a and 322b may be disposed so as to be offset from each other. As such, according to the embodiment, since the connection points P1 and P2 of the connection pieces 322a and 322b are offset from each other, when the separator 600 is inserted into a third slit 322S defined by the two connection pieces 322a and 322b, the contact force between the separator 600 and the connection pieces 322a and 322b may increase, and the separator 600 may be supported more flexibly. Thus, even when the separator 600 is implemented as an ultra-thin film having a thickness of 0.1 mm or less, the connection terminal 320 may be prevented from being unintentionally separated from the separator 600. That is, the force of holding the connection terminal 320 to the separator 600 may increase, which results in improved reliability of the product.

The terminal connection portion 322 of the connection terminal 320 may have a rectangular parallelepiped shape including an opening in the front side thereof, but the disclosure is not limited thereto.

In addition, the connection terminal 320 may further include a locking protrusion 326. The locking protrusion 326 may have a shape that protrudes from the bottom surface of the terminal connection portion 322 toward the wire-holding portion 324. The locking protrusion 326 may have a shape that is bent and extends downwards from the bottom surface of the terminal connection portion 322.

In addition, the connection terminal 320 may further include a connection guide portion 328. The connection guide portion 328 may prevent the connection terminal 320, connected to the separator 600 through the housing 310, from being separated from the separator 600.

In addition, the connector 300 may further include a terminal position assurance (TPA) 330. The TPA 330 may be detachably fitted into TPA terminal insertion holes (e.g. 330S1 and 330S2 shown in FIGS. 9A and 9B to be described later) located in the back surface BS of the housing 310, and may cause the connection terminals 320 to be press-fitted into the housing 310 through the connection terminal insertion holes (e.g. 330T shown in FIGS. 9A and 9B to be described later) located in the back surface BS of the housing 310. That is, the TPA 330 may increase the insertion force of the connection terminals 320, may prevent erroneous assembly by correctly positioning the connection terminals 320, and may make it possible to continuously sense the voltage value with high electrical reliability in spite of the narrow pitch between the separators 600. To this end, the housing 310 may include connection terminal insertion holes and TPA terminal insertion holes formed above the connection terminal insertion holes.

Referring to FIGS. 4A and 4B, the TPA 330 may be disposed between the first and second lever operators 312A and 312B in the third direction, and may include fixing pieces 330U and 330D and a third head portion HD3.

The third head portion HD3 may extend from the fixing pieces 330U and 330D, and may be disposed on the back surface BS of the housing 310 in the state in which the connector 300 is coupled to the fuel cell.

The fixing pieces 330U and 330D may be coupled to the housing 310 in an insertion manner, and may be located inside the housing 310. Referring to FIG. 2, the fixing pieces 330U and 330D may include an upper-surface-fixing piece 330U and a lower-surface-fixing piece 330D.

Figure 9A:
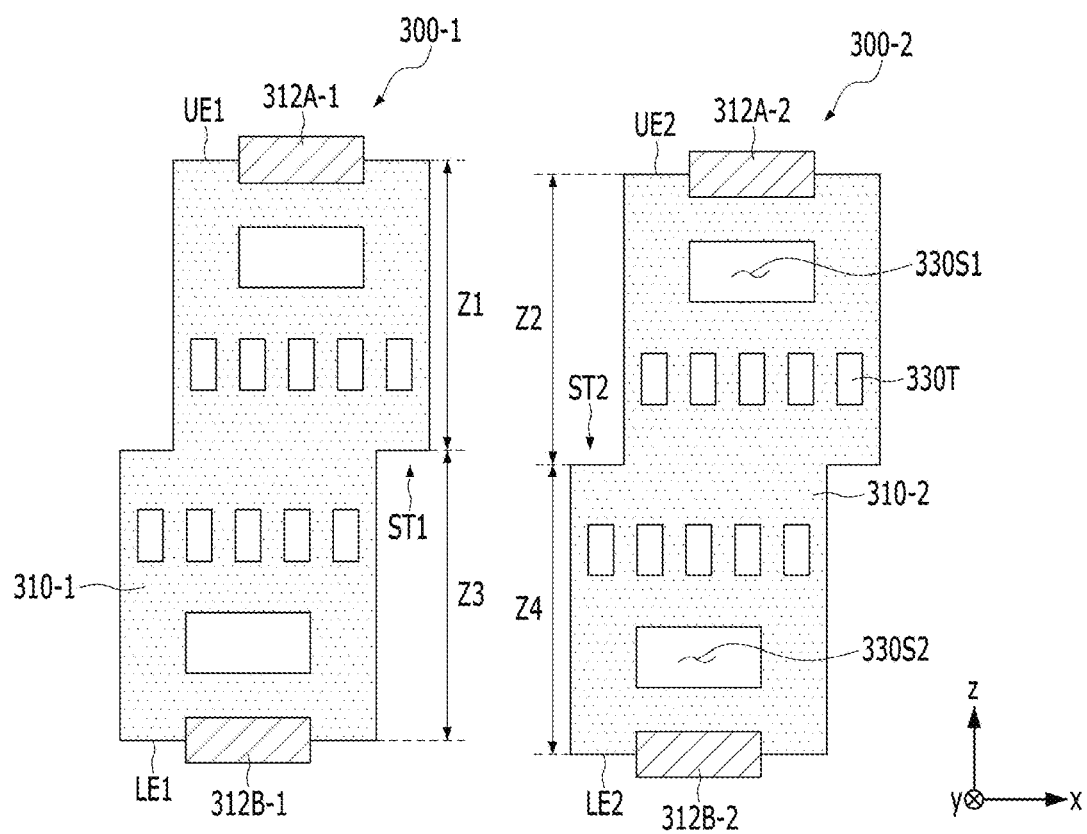
FIGS. 9A and 9B show the arrangement of a plurality of cell-monitoring connectors according to an embodiment.
Figure 9B:
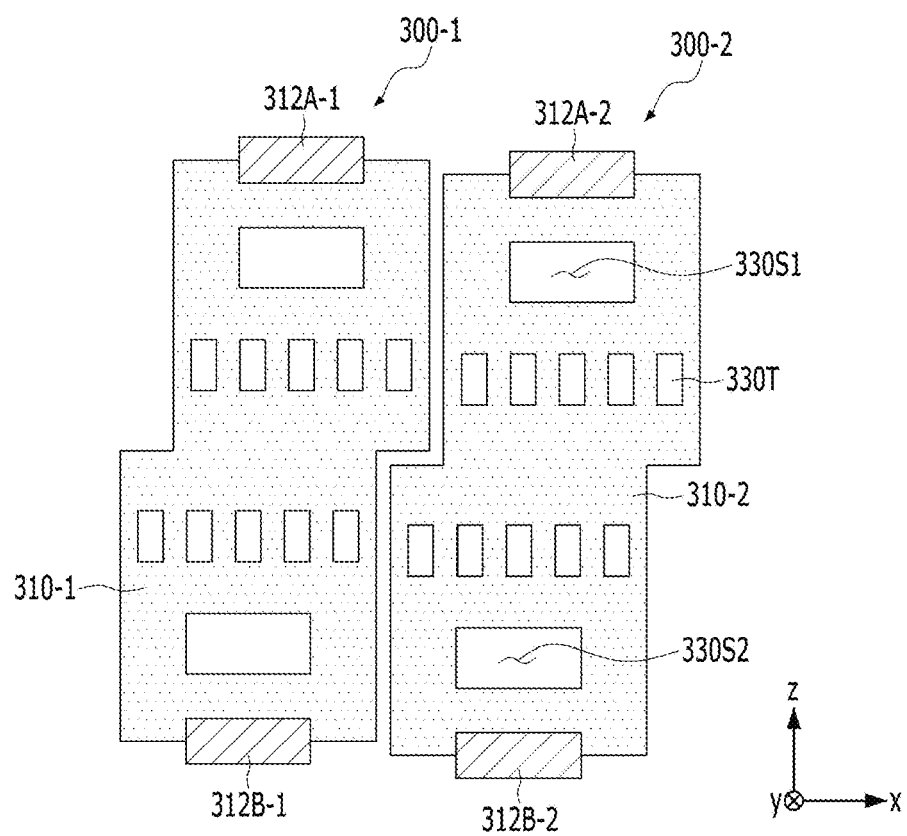

FIGS. 9A and 9B show the arrangement of a plurality of connectors 300-1 and 300-2 according to an embodiment.

FIG. 9A is a view showing the separated state of the first and second connectors 300-1 and 300-2, which are adjacent to each other in the first direction, and FIG. 9B is a view showing the coupled state of the first and second connectors 300-1 and 300-2, which are adjacent to each other in the first direction.

Each of the first and second connectors 300-1 and 300-2 shown in FIGS. 9A and 9B may correspond to an embodiment of the connector 300 described above. Thus, 1-1$^{st}$ and 1-2$^{nd}$ lever operators 312A-1 and 312B-1 of the first connector 300-1 may respectively correspond to embodiments of the first and second lever operators 312A and 312B of the connector 300 described above. In addition, 2-1$^{st}$ and 2-2$^{nd}$ lever operators 312A-2 and 312B-2 of the second connector 300-2 may respectively correspond to embodiments of the first and second lever operators 312A and 312B of the connector 300 described above. In addition, each of a first housing 310-1 of the first connector 300-1 and a second housing 310-2 of the second connector 300-2 may correspond to an embodiment of the housing 310 of the connector 300 described above.

In addition, each of the housings 310-1 and 310-2 of the first and second connectors 300-1 and 300-2 shown in FIGS. 9A and 9B may include first holes 330S1 and 330S2 and second holes 330T formed therein.

Each of the upper-surface-fixing piece 330U and the lower-surface-fixing piece 330D may be inserted into a corresponding one of the two first holes 330S1 and 330S2, which correspond to the TPA terminal insertion holes, and the connection terminals 320 may be inserted into the second holes 330T, which correspond to the connection terminal insertion holes.

Among the first and second connectors 300-1 and 300-2 that are adjacent to each other, the first connector 300-1 may include a first stepped portion ST1 formed in a side surface thereof, and the second connector 300-2 may include a second stepped portion ST2 formed in a side surface thereof so as to mesh with the first stepped portion ST1.

According to the embodiment, the first length Z1 from the first stepped portion ST1 to the upper edge UE1 of the first connector 300-1 in a direction parallel to the third direction (e.g. the +z-axis direction) may be different from the second length Z2 from the second stepped portion ST2 to the upper edge UE2 of the second connector 300-2 in a direction parallel to the third direction (e.g. the +z-axis direction). For example, the first length Z1 may be greater than the second length Z2.

In addition, the third length Z3 from the first stepped portion ST1 to the lower edge LE1 of the first connector 300-1 in a direction parallel to the third direction (e.g. the −z-axis direction) may be different from the fourth length Z4 from the second stepped portion ST2 to the lower edge LE2 of the second connector 300-2 in a direction parallel to the third direction (e.g. the −z-axis direction). For example, the fourth length Z4 may be greater than the third length Z3.

Alternatively, unlike the configuration shown in the drawings, when the first length Z1 is less than the second length Z2, the fourth length Z4 may be less than the third length Z3.

As described above, since the first length Z1 and the second length Z2 are different from each other or the third length Z3 and the fourth length Z4 are different from each other, it is possible to physically prevent a problem in which the first connector 300-1 and the second connector 300-2, which are adjacent to each other, are erroneously assembled to each other.

In addition, the upper portion of the first connector 300-1 and the lower portion of the second connector 300-2 may have the same color as each other, and the lower portion of the first connector 300-1 and the upper portion of the second connector 300-2 may have the same color as each other. For example, the 1-1st lever operator 312A-1 of the first connector 300-1 and the 2-2nd lever operator 312B-2 of the second connector 300-2 may have the same color as each other, and the 1-2nd lever operator 312B-1 of the first connector 300-1 and the 2-1st lever operator 312A-2 of the second connector 300-2 may have the same color as each other.

Accordingly, it is possible to visually prevent a problem in which the first connector 300-1 and the second connector 300-2, which are adjacent to each other, are erroneously assembled to each other.

Hereinafter, the process of detachably mounting the connector 300 having the above-described configuration to the fuel cell will be described.

FIGS. 10A to 10D are cross-sectional views for explaining the process in which the connector 300 according to the embodiment is mounted in the receiving space in the fuel cell.

Referring to FIG. 10A, in order to insert the connector 300 into the receiving space, the housing 310 is moved toward the receiving space in the second direction indicated by the arrow AR1.

Thereafter, referring to FIG. 10B, in order to move the first and second latching protrusions 314PA and 314PB of the first and second levers 314A and 314B from the first position to the second position, the first lever operator 312A is pressed in the third direction (e.g. the −z-axis direction) indicated by the arrow AR2, and the second lever operator 312B is pressed in the third direction (e.g. the +z-axis direction) indicated by the arrow AR3. As the first and second latching protrusions 314PA and 314PB move from the first position to the second position, at least a portion of the housing 310 of the connector 300 may be received in the receiving space. Thereafter, when the pressing is stopped, the first and second lever operators 312A and 312B are restored to the original positions thereof by the inherent elasticity thereof.

Figure 10D:
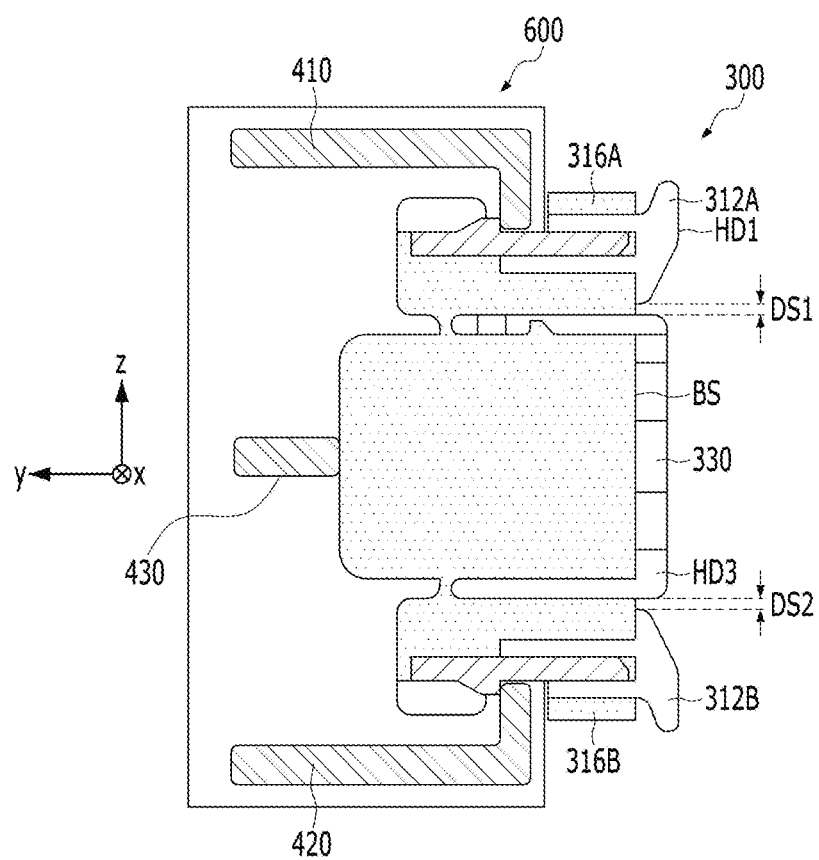

Thereafter, referring to FIG. 10C, after the first and second latching protrusions 314PA and 314PB are caught and fixed by the first and second latching parts 410 and 420, the first and second lever operators 312A and 312B are pressed in the second direction to be moved from the withdrawn position to the introduced position. Accordingly, as shown in FIG. 10D, the latching protrusions 314PA and 314PB are located at the first position, and the first and second lever operators 312A and 312B are located at the introduced position. That is, the first lever operator 312A is secondarily pressed in the second direction to be moved from the withdrawn position ① to the introduced position ③ via the intermediate position ②, and the second lever operator 312B is secondarily pressed in the second direction to be moved from the withdrawn position ④ to the introduced position ⑥ via the intermediate position ⑤, thereby completing the mounting of the connecter 300 to the fuel cell.

The connector 300 coupled to the separators 600 of the fuel cell may be separated from the fuel cell in the reverse order to the above-described mounting order.

Hereinafter, the configuration according to an embodiment for enabling a worker who mounts the connector 300 to the fuel cell to easily determine whether the connector 300 is completely mounted to the fuel cell, i.e. whether the latching protrusions 314PA and 314PB are in the state of being caught by the latching parts 410 and 420, will be described.

After the housing 310 is inserted into the receiving space H1 in the second direction, when the first and second lever operators 312A and 312B are capable of linearly moving in the second direction from the withdrawn position shown in FIG. 5B to the introduced position shown in FIG. 5A, the worker may determine that the latching protrusions 314PA and 314PB are in the state of being caught by the latching parts 410 and 420 and that the connector 300 has been completely mounted to the fuel cell.

However, after the housing 310 is inserted into the receiving space H1 in the second direction, when the first and second lever operators 312A and 312B are not capable of linearly moving in the second direction from the withdrawn position shown in FIG. 5B to the introduced position shown in FIG. 5A, the worker may determine that the latching protrusions 314PA and 314PB are not in the state of being caught by the latching parts 410 and 420 and that the connector 300 has not been mounted to the fuel cell.

The embodiment may be configured such that the first and second lever operators 312A and 312B are not capable of linearly moving in the second direction from the withdrawn position shown in FIG. 5B to the introduced position shown in FIG. 5A when the connector 300 has not been mounted to the fuel cell, i.e. when the latching protrusions 314PA and 314PB are not in the state of being caught by the latching parts 410 and 420. That is, the width in the third direction of the first head portion HD1 and/or the spacing distance in the third direction between the first head portion HD1 and the third head portion HD3 may be determined so as to allow or interrupt the linear motion of the first and second lever operators 312A and 312B depending on whether the latching protrusions 314PA and 314PB are in the state of being completely caught by the latching parts 410 and 420. Here, the spacing distance, as shown in FIG. 10A, may be the spacing distance in the third direction between the first head portion HD1 and the third head portion HD3 when the first and second lever operators 312A and 312B are located at the withdrawn position.

The width in the third direction of the first head portion HD1 and/or the spacing distance in the third direction between the first head portion HD1 and the third head portion HD3 may be determined such that the first head portion HD1 overlaps at least a portion of the third head portion HD3 in the second direction when the latching protrusions 314PA and 314PB are not in the state of being caught by the latch portions 410 and 420, thus making it impossible for the first and second lever operators 312A and 312B to linearly move from the withdrawn position to the introduced position. For example, the width in the third direction of the first head portion HD1 and/or the spacing distance in the third direction between the first head portion HD1 and the third head portion HD3 may be determined such that, as shown in FIG. 4B, the lower surface 312bs of the first head portion HD1 is in contact with the upper surface H3U of the third head portion HD3 when the latching protrusions 314PA and 314PB are not in the state of being caught by the latching parts 410 and 420.

In addition, the width in the third direction of the first head portion HD1 and/or the spacing distance in the third direction between the first head portion HD1 and the third head portion HD3 may be determined such that the first head portion HD1 does not overlap the third head portion HD3 in the second direction when the first lever operator 312A located at the withdrawn position is restored to the previous position before being pressed in the third direction (e.g. the −z-axis direction), the second lever operator 312B located at the withdrawn position is restored to the previous position before being pressed in the third direction (e.g. the +z-axis direction), and the latching protrusions 314PA and 314PB are caught by the latching parts 410 and 420, thus making it possible for the first and second lever operators 312A and 312B to linearly move from the withdrawn position to the introduced position. For example, the width in the third direction of the first head portion HD1 and/or the spacing distance in the third direction between the first head portion HD1 and the third head portion HD3 may be determined such that the lower surface 312bs of the first head portion HD1 is not in contact with the upper surface H3U of the third head portion HD3 when the latching protrusions 314PA and 314PB are in the state of being caught by the latching parts 410 and 420.

In addition, according to the embodiment, as shown in FIG. 10D, in the state in which at least a portion of the housing 310 is inserted into the receiving space, when the latching protrusions 314PA and 314PB located at the first position are caught by the latching parts 410 and 420 and the first and second lever operators 312A and 312B are located at the introduced position, the first head portion HD1 and the third head portion HD3 may be disposed opposite each other in the third direction on the back surface BS of the housing 310.

Referring to FIG. 10B, the embodiment may be configured such that, when the first lever operator 312A is pressed in the third direction (e.g. the −z-axis direction) in order to mount or demount the connector 300 to or from the fuel cell, the first lever operator 312A moves a first predetermined distance PDS1 or more, and accordingly, the latching protrusion 314PA may move from the first position to the second position. In addition, the embodiment may be configured such that, when the second lever operator 312B is pressed in the third direction (e.g. the +z-axis direction) in order to mount or demount the connector 300 to or from the fuel cell, the second lever operator 312B moves a second predetermined distance PDS2 or more, and accordingly, the latching protrusion 314PB may move from the first position to the second position. Here, each of the first and second predetermined distances PDS1 and PDS2 is defined as a minimum distance (hereinafter, referred to as a "mounting/demounting distance") that the first and second lever operators 312A and 312B need to move in order to mount or demount the connector 300 to or from the fuel cell.

With this configuration, referring to FIG. 10D, after the connector 300 is mounted to the fuel cell, the first spacing distance DS1 in the third direction between the first head portion HD1 of the first lever operator 312A and the third head portion HD3, which are opposite each other, may be greater than 0, and may be less than the first predetermined distance PDS1, i.e. the mounting/demounting distance. In addition, after the connector 300 is mounted to the fuel cell, the second spacing distance DS2 in the third direction between the first head portion HD1 of the second lever operator 312B and the third head portion HD3, which are opposite each other, may be greater than 0, and may be less than the second predetermined distance PDS2, i.e. the mounting/demounting distance.

In the case in which the first and second spacing distances DS1 and DS2 are determined as described above, even when at least one of the latching protrusions 314PA and 314PB or the latching parts 410 and 420 is damaged after the connector 300 is mounted to the fuel cell, as shown in FIG. 10D, it is possible to prevent the latching protrusions 314PA and 314PB from being separated from the latching parts 410 and 420.

Hereinafter, a fuel cell according to a comparative example and the connector according to the embodiment will be described.

Figure 11A:
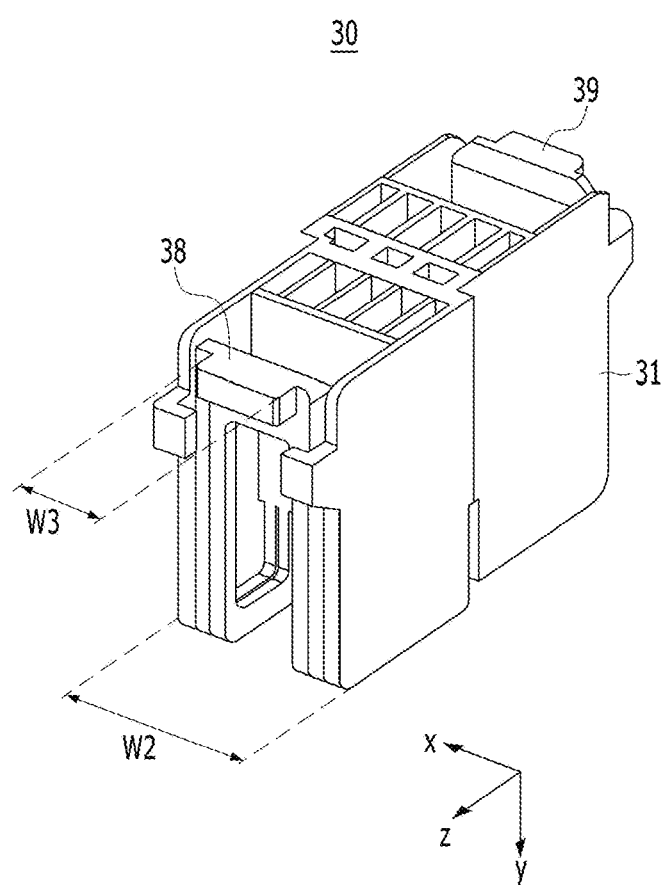
FIGS. 11A and 11B are a perspective view and a front view, respectively, of a cell-monitoring connector according to a comparative example.
Figure 11B:
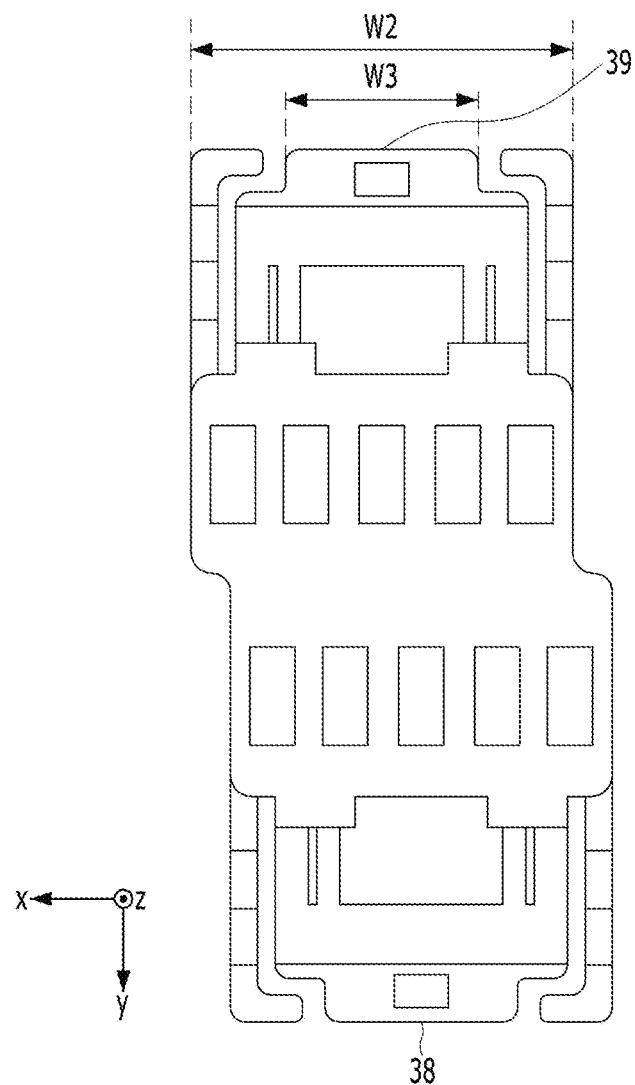

FIGS. 11A and 11B are a perspective view and a front view, respectively, of a connector 30 according to the comparative example.

The connector 30 shown in FIGS. 11A and 11B includes a housing 31 and unlocking-lever-pressing parts 38 and 39. It is assumed that the connector 30, the housing 31, and the unlocking-lever-pressing parts 38 and 39 shown in FIGS. 11A and 11B perform the same functions as the connector 300, the housing 310, and the lever operators 312A and 312B according to the embodiment, respectively.

In the comparative example, the third width W3 in the first direction of each of the unlocking-lever-pressing parts 38 and 39 is less than the second width W2 in the first direction of the connector 30. In particular, in the case of the connector 30 for measuring the voltage of a cell stack having a narrow pitch, the third width W3 in the first direction of each of the unlocking-lever-pressing parts 38 and 39 is further reduced. The third width W3 of each of the unlocking-lever-pressing parts 38 and 39 corresponds to the width of a touch surface that is touched by the worker. When the third width W3 is reduced, it may become more difficult for the worker to mount or demount the connector 30 to or from the fuel cell, and the gripping sensation experienced by the worker may be deteriorated.

On the other hand, referring to FIG. 2, the connector 300 according to the embodiment may be configured such that the first width W1 in the first direction of each of the first and second lever operators 312A and 312B is the same as the second width W2 in the first direction of the connector 300. Therefore, since the touch surface is larger than that of the comparative example, it may be easier for the worker to mount or demount the connector 300 to or from the fuel cell than the comparative example, and the gripping sensation experienced by the worker may be improved. In particular, when it is desired to measure the voltage of a cell stack having a narrow pitch using the connector 300, it may also be easier for the worker to mount or demount the connector 300 according to the embodiment to or from the fuel cell than the comparative example.

Further, in the case in which the connector 30 according to the comparative example has a locking structure in which a lever-type locking part is locked to the fuel cell, when the connector 30 is repeatedly mounted to and demounted from the fuel cell, pressing force may be repeatedly applied to the lever-type locking part, thus damaging or deforming the locking part. As a result, the connector 30 may be separated from the fuel cell, and contact resistance may increase during the evaluation of vehicle vibration.

On the other hand, as described above, since the connector 300 according to the embodiment is configured such that the first and second spacing distances DS1 and DS2 are greater than 0 or less than the mounting/demounting distances PDS1 and PDS2, even when at least one of the latching protrusions 314PA and 314PB or the latching parts 410 and 420 is damaged after the connector 300 is mounted to the fuel cell, it is possible to prevent the latching protrusions 314PA and 314PB from being separated from the latching parts 410 and 420. As a result, the connector 300 may monitor the cell without being separated from the fuel cell despite a change in the external environment such as vehicle vibration, thereby increasing the reliability of monitoring of the cell.

As is apparent from the above description, a cell-monitoring connector configured to be detachably mounted to a fuel cell according to the embodiment may physically prevent a problem in which neighboring connectors are erroneously assembled to each other by making the lengths of the neighboring connectors different from each other, and may visually prevent a problem in which neighboring connectors are erroneously assembled to each other by making the upper portion of one connector and the lower portion of the other connector adjacent thereto have the same color as each other, thereby enabling a worker to easily determine whether the cell-monitoring connector has been completely mounted to the fuel cell. In addition, even when at least one of latching protrusions or latching parts is damaged after the cell-monitoring connector is mounted to the fuel cell, it is possible to prevent the latching protrusions from being separated from the latching parts. Accordingly, the cell-monitoring connector may monitor the cell without being separated from the fuel cell despite a change in the external environment, such as vehicle vibration, thereby increasing the reliability of monitoring of the cell. In addition, since the touch surface of a lever operator is relatively large, it may be easier for the worker to mount or demount the cell-monitoring connector to or from the fuel cell than the comparative example, and the gripping sensation experienced by the worker may be improved.

The above-described various embodiments may be combined with each other without departing from the objects of the present disclosure unless they are contrary to each other. In addition, for any element that is not described in detail of any of the various embodiments, reference may be made to the description of an element having the same reference numeral in another embodiment.

While the present disclosure has been particularly shown and described with reference to exemplary embodiments thereof, these embodiments are only proposed for illustrative purposes and do not restrict the present disclosure, and it will be apparent to those skilled in the art that various changes in form and detail may be made without departing from the essential characteristics of the embodiments set forth herein. For example, respective configurations set forth in the embodiments may be modified and applied. Further, differences in such modifications and applications should be construed as falling within the scope of the present disclosure as defined by the appended claims.

What is claimed is:

1. A cell-monitoring connector configured to be detachably mounted to a fuel cell that comprises a plurality of separators disposed so as to be spaced apart from each other in a first direction, each of the separators comprising a receiving recess formed therein, and a plurality of latching parts, each being disposed near the receiving recess, the cell-monitoring connector comprising:
    a housing configured such that at least a portion thereof is insertable into a receiving space, defined by the receiving recess formed in each of the separators, in a second direction that intersects the first direction;
    a pair of lever operators configured to be movable by a first external pressure in a third direction that intersects the first direction and the second direction; and
    a plurality of levers respectively coupled to the pair of lever operators inside the housing, wherein the plurality of levers comprises a plurality of latching protrusions configured to operate in connection with movement of the lever operators, the latching protrusions movable between a first position at which the latching protrusions protrude in the third direction from an outer surface of the housing and a second position at which the latching protrusions do not protrude from the outer surface of the housing so as to be caught by or released from the latching parts.

2. The cell-monitoring connector according to claim 1, further comprising:
    a first connector and a second connector disposed adjacent to each other in the first direction;
    wherein the first connector comprises a first stepped portion formed in a side surface thereof; and
    wherein the second connector comprises a second stepped portion formed in a side surface thereof to mesh with the first stepped portion.

3. The cell-monitoring connector according to claim 2, wherein a length from the first stepped portion to an upper edge or a lower edge of the first connector in a direction parallel to the third direction is different from a length from the second stepped portion to an upper edge or a lower edge of the second connector in a direction parallel to the third direction.

4. The cell-monitoring connector according to claim 1, further comprising a damage-preventing part disposed so as to protrude from a front end of the housing in a direction opposite a direction in which the first external pressure is applied to each of the pair of lever operators.

5. The cell-monitoring connector according to claim 1, wherein each of the plurality of separators is fitted into at least one slit located between the plurality of latching protrusions spaced apart from each other at regular intervals in the first direction.

6. The cell-monitoring connector according to claim 5, wherein the plurality of levers is made of an insulating material.

7. The cell-monitoring connector according to claim 5, wherein the at least one slit comprises a plurality of slits;
    wherein the plurality of latching protrusions has a constant thickness in the first direction; and
    wherein the plurality of slits has a constant width in the first direction.

8. A cell-monitoring connector configured to be detachably mounted to a fuel cell that comprises a plurality of separators disposed so as to be spaced apart from each other in a first direction, each of the separators comprising a receiving recess formed therein, and a plurality of latching parts, each being disposed near the receiving recess, the cell-monitoring connector comprising:
    a housing configured such that at least a portion thereof is insertable into a receiving space, defined by the receiving recess formed in each of the separators, in a second direction that intersects the first direction;
    a pair of lever operators configured to be movable by a first external pressure in a third direction that intersects the first direction and the second direction; and
    a plurality of levers respectively coupled to the pair of lever operators inside the housing;
    wherein each of the pair of lever operators comprises a first head portion configured to receive the first external pressure, and a first tail portion extending from the first head portion to be connected to the plurality of levers;
    wherein the plurality of levers comprises a plurality of latching protrusions configured to operate in connection with movement of the lever operators, the latching protrusions movable between a first position at which the latching protrusions protrude in the third direction from an outer surface of the housing and a second position at which the latching protrusions do not protrude from the outer surface of the housing so as to be caught by or released from the latching parts; and
    wherein the plurality of levers comprises a plurality of second head portions connected to the first tail portion, and a plurality of second tail portions respectively extending from the plurality of second head portions, each of the second tail portions being provided with a respective one of the latching protrusions.

9. The cell-monitoring connector according to claim 8, wherein a first width in the first direction of the first head portion is the same as a second width in the first direction of the cell-monitoring connector.

10. The cell-monitoring connector according to claim 8, wherein each of the lever operators is linearly movable in the second direction between an introduced position and a withdrawn position by a second external pressure that is different from the first external pressure, and wherein each of the lever operators is coupled to the plurality of levers.

11. The cell-monitoring connector according to claim 10, wherein the first tail portion comprises a first surface that faces the plurality of second head portions;
    wherein each of the plurality of second head portions comprises a second surface that faces the first surface;

wherein one of the first surface and the second surface comprises a recess, and a remaining one of the first surface and the second surface comprises a projection having a shape corresponding to a shape of the recess; and wherein, when each of the lever operators moves linearly, the recess and the projection are coupled to each other in a sliding manner.

12. The cell-monitoring connector according to claim 11, wherein the recess is one of a plurality of recesses and the projection is one of a plurality of projections;

wherein, when each of the lever operators is located at the introduced position, all of the plurality of recesses are coupled to all of the plurality of projections; and wherein, when each of the lever operators is located at the withdrawn position, some of the plurality of recesses are coupled to some of the plurality of projections.

13. The cell-monitoring connector according to claim 10, wherein, when the housing is inserted into the receiving space in the second direction and the plurality of latching protrusions is caught by the plurality of latching parts at the first position, each of the lever operators is linearly movable in the second direction from the withdrawn position to the introduced position.

14. The cell-monitoring connector according to claim 10, wherein the receiving recess comprises:

a lower surface facing the housing to be received in the receiving recess; and a side surface extending from the lower surface in a direction parallel to the second direction to define the receiving recess together with the lower surface, wherein the housing comprises:

a front surface facing the lower surface;

a back surface formed opposite the front surface; and an upper surface and a lower surface formed opposite each other in the third direction between the front surface and the back surface, wherein the outer surface of the housing corresponds to at least one of the upper surface or the lower surface.

15. The cell-monitoring connector according to claim 14, further comprising a terminal position assurance (TPA) capable of being disposed between the pair of lever operators, wherein the TPA comprises:

a fixing piece coupled to the housing; and a third head portion extending from the fixing piece so as to be disposed on the back surface of the housing.

16. The cell-monitoring connector according to claim 15, wherein the pair of lever operators is elastic to be restored in a direction opposite the third direction when the first external pressure is not applied thereto.

17. The cell-monitoring connector according to claim 15, wherein, when the plurality of latching protrusions is not in a state of being caught by the plurality of latching parts, the first head portion has a width in the third direction so as to overlap at least a portion of the third head portion in the second direction.

18. The cell-monitoring connector according to claim 15, wherein, when at least a portion of the housing is in a state of being inserted into the receiving space, the plurality of latching protrusions located at the first position is caught by the plurality of latching parts; and wherein, when the pair of lever operators is located at the introduced position, the first head portion and the third head portion are disposed opposite each other in the third direction on the back surface of the housing.

19. The cell-monitoring connector according to claim 18, wherein, when the first head portion and the third head portion are opposite each other, a spacing distance in the third direction between the first head portion and the third head portion is greater than zero and is less than a mounting/demounting distance.

20. An apparatus, comprising:

a fuel cell; and a cell-monitoring connector configured to be detachably mounted to the fuel cell, wherein the fuel cell comprises:

a plurality of separators disposed so as to be spaced apart from each other in a first direction, each of the separators comprising a receiving recess formed therein; and a plurality of latching parts, each being disposed near the receiving recess, and wherein the cell-monitoring connector comprises:

a housing configured such that at least a portion thereof is inserted into a receiving space, defined by the receiving recess formed in each of the separators, in a second direction that intersects the first direction;

a pair of lever operators configured to be movable by a first external pressure in a third direction that intersects the first direction and the second direction; and a plurality of levers respectively coupled to the pair of lever operators inside the housing, wherein the plurality of levers comprises a plurality of latching protrusions configured to operate in connection with movement of the lever operators, the latching protrusions moving between a first position at which the latching protrusions protrude in the third direction from an outer surface of the housing and a second position at which the latching protrusions do not protrude from the outer surface of the housing so as to be caught by or released from the latching parts.

* * * * *